(12) United States Patent
De Groot et al.

(10) Patent No.: US 12,007,590 B2
(45) Date of Patent: Jun. 11, 2024

(54) TWO-DIMENSIONAL DIFFRACTION GRATING

(71) Applicant: ASML Netherlands B.V., Veldhoven (NL)

(72) Inventors: Pieter Cristiaan De Groot, Heeze (NL); Johannes Jacobus Matheus Baselmans, Oirschot (NL); Derick Yun Chek Chong, 's Hertogenbosch (NL); Yassin Chowdhury, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/965,172

(22) PCT Filed: Jan. 4, 2019

(86) PCT No.: PCT/EP2019/050132
§ 371 (c)(1),
(2) Date: Jul. 27, 2020

(87) PCT Pub. No.: WO2019/149467
PCT Pub. Date: Aug. 8, 2019

(65) Prior Publication Data
US 2020/0363573 A1 Nov. 19, 2020

(30) Foreign Application Priority Data

Jan. 31, 2018 (EP) ..................................... 18154475

(51) Int. Cl.
*G02B 5/18* (2006.01)
*G01M 11/02* (2006.01)
(Continued)

(52) U.S. Cl.
CPC ....... *G02B 5/1819* (2013.01); *G01M 11/0271* (2013.01); *G02B 27/0012* (2013.01); *G02B 27/4233* (2013.01); *G03F 7/706* (2013.01)

(58) Field of Classification Search
CPC .............. G02B 5/1819; G02B 27/0012; G02B 27/4233; G02B 5/005; G01M 11/0271;
(Continued)

(56) References Cited

U.S. PATENT DOCUMENTS 3,586,925 A * 6/1971 Collard ................... H01L 21/00
148/DIG. 115
4,737,858 A * 4/1988 DeBaryshe ............ H04N 1/036
358/296

(Continued)

FOREIGN PATENT DOCUMENTS

CN 1438477 A * 8/2003 ......... G02B 27/0025
CN 102244024 A * 11/2011
(Continued)

OTHER PUBLICATIONS

International Search Report and Written Opinion of the International Searching Authority directed to related International Patent Application No. PCT/EP2019/050132, dated Jul. 1, 2019; 22 pages.

(Continued)

*Primary Examiner* — Mohamed K Amara
(74) *Attorney, Agent, or Firm* — Sterne, Kessler, Goldstein & Fox P.L.L.C.

(57) ABSTRACT

A two-dimensional diffraction grating for a phase-stepping measurement system for determining an aberration map for a projection system comprises a substrate provided with a square array of through-apertures, wherein the diffraction grating is self-supporting. It will be appreciated that for a substrate provided with a square array of through-apertures to be self-supporting at least some substrate material is
(Continued)

provided between each through-aperture and the adjacent through apertures. A method of designing a two-dimensional diffraction grating for a phase-stepping measurement system for determining an aberration map for a projection system comprises: selecting a general geometry for the two-dimensional diffraction grating, the general geometry having at least one parameter; and selecting values for the least one parameter that result in a grating efficiency map for the two-dimensional diffraction grating so as to control the contributions to a first harmonic of a phase stepping signal.

16 Claims, 18 Drawing Sheets

(51) Int. Cl.
  *G02B 27/00* (2006.01)
  *G02B 27/42* (2006.01)
  *G03F 7/00* (2006.01)
(58) Field of Classification Search
  CPC ........... G01M 11/0242; G01M 11/0264; G03F 7/706; G03F 1/24; G03F 1/44; G03F 1/62; B82Y 10/00; B82Y 40/00
  See application file for complete search history.

(56) References Cited

U.S. PATENT DOCUMENTS

| | | | | |
|---|---|---|---|---|
| 5,062,705 | A * | 11/1991 | Sato | G01M 11/0264 356/124 |
| 5,424,552 | A * | 6/1995 | Tsuji | G03F 7/70241 250/548 |
| 6,371,310 | B1 * | 4/2002 | Master | H01L 21/67333 211/41.18 |
| 7,283,252 | B2 * | 10/2007 | Kato | G03F 7/706 356/521 |
| 7,304,749 | B2 * | 12/2007 | Ohkubo | G03F 7/706 356/521 |
| 7,417,745 | B2 * | 8/2008 | Haidner | G01M 11/0264 356/521 |
| 8,004,691 | B2 * | 8/2011 | Ouchi | G01M 11/0264 356/521 |
| 10,349,908 | B2 * | 7/2019 | Yun | G01N 23/041 |
| 10,371,634 | B2 * | 8/2019 | Rothberg | G01N 21/6428 |
| 10,564,348 | B2 * | 2/2020 | Kopp | G02B 6/255 |
| 2001/0028462 | A1 * | 10/2001 | Ichihara | G01B 9/02072 356/512 |
| 2002/0145717 | A1 * | 10/2002 | Baselmans | G01M 11/0264 356/399 |
| 2003/0184736 | A1 | 10/2003 | Fukuhara et al. | |
| 2003/0215053 | A1 * | 11/2003 | Ichihara | G01B 9/02072 356/521 |
| 2004/0174531 | A1 * | 9/2004 | Freimann | G01M 11/005 356/512 |
| 2006/0119758 | A1 * | 6/2006 | Chai | G02F 1/134309 349/43 |
| 2008/0186509 | A1 | 8/2008 | Kato | |
| 2009/0152453 | A1 * | 6/2009 | Li | G02B 26/06 250/235 |
| 2009/0290136 | A1 | 11/2009 | Ouchi et al. | |
| 2010/0284064 | A1 * | 11/2010 | Kruizinga | G21K 1/06 359/359 |
| 2013/0312822 | A1 * | 11/2013 | Lin | H01L 31/03923 136/256 |
| 2017/0212022 | A1 * | 7/2017 | Kawara | B01D 29/0093 |
| 2019/0003922 | A1 * | 1/2019 | Samaniego | G03F 7/706 |
| 2020/0292296 | A1 * | 9/2020 | Lu | G01B 9/02034 |
| 2021/0026250 | A1 * | 1/2021 | Tang | G03F 7/706 |
| 2022/0245321 | A1 * | 8/2022 | Kuo | G06F 30/398 |

FOREIGN PATENT DOCUMENTS

| | | | | |
|---|---|---|---|---|
| EP | 1 231 517 A1 | 8/2002 | | |
| FR | 2931255 A1 * | 11/2009 | ........... | G02B 13/004 |
| JP | 2001230180 A * | 8/2001 | ........... | H01L 21/027 |
| JP | 2011-510480 A | 3/2011 | | |
| JP | 2011-108696 A | 6/2011 | | |
| JP | 2013-214637 A | 10/2013 | | |
| KR | 100579616 B1 * | 11/2011 | ........... | H01L 21/027 |
| WO | WO-2005095119 A1 * | 10/2005 | ............. | B41M 3/14 |
| WO | WO 2006/115292 A1 | 11/2006 | | |

OTHER PUBLICATIONS

International Preliminary Report on Patentability directed to related International Patent Application No. PCT/EP2019/050132, dated Aug. 4, 2020; 17 pages.

* cited by examiner

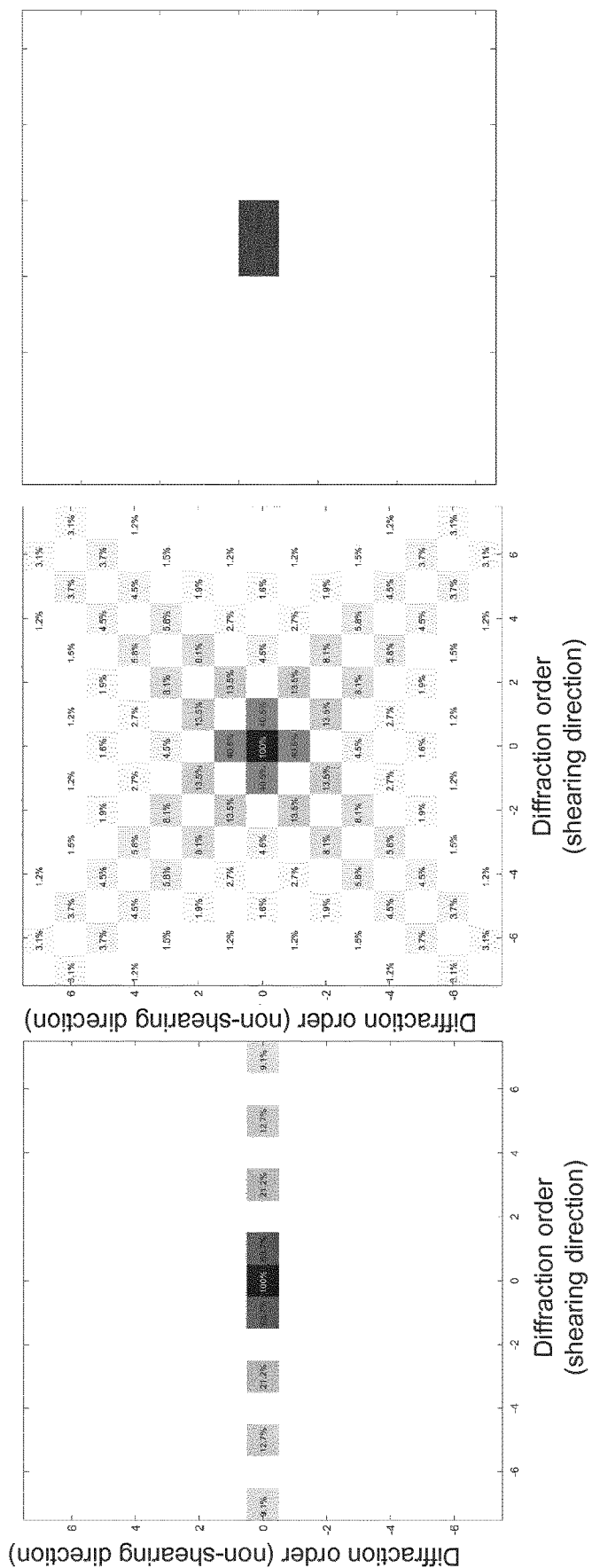

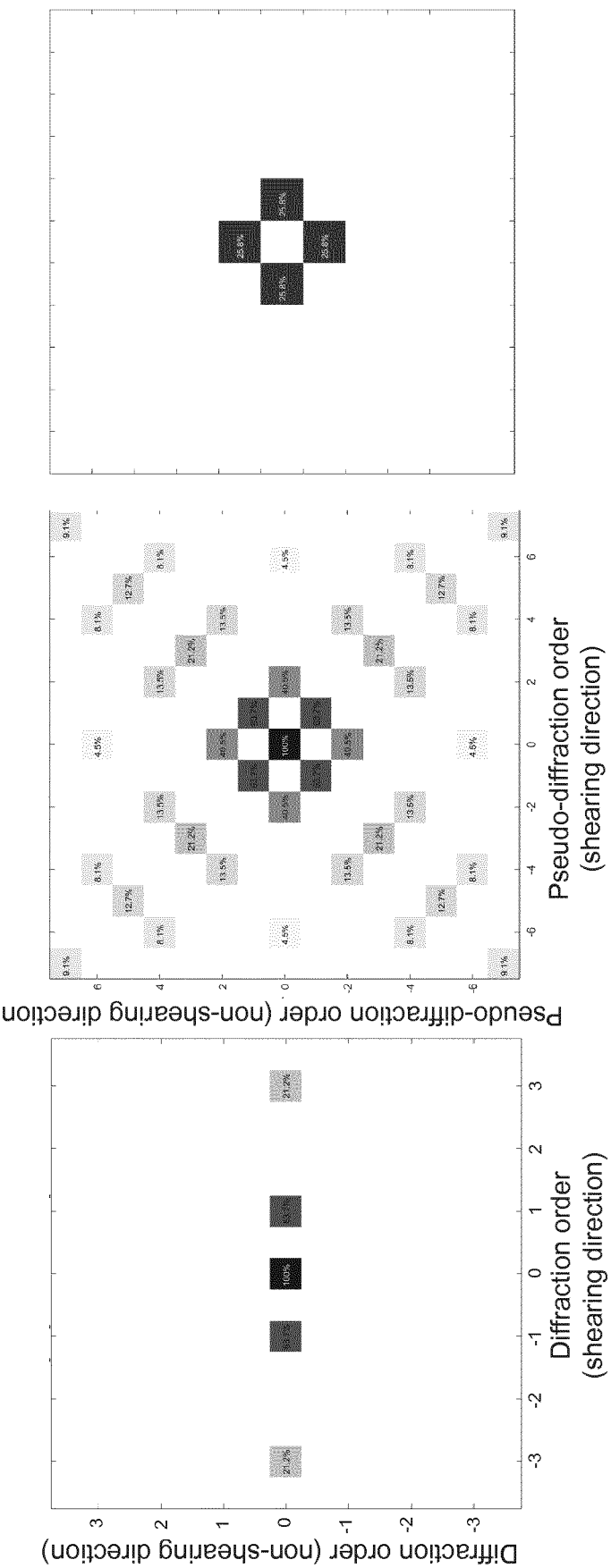

TWO-DIMENSIONAL DIFFRACTION GRATING

CROSS-REFERENCE TO RELATED APPLICATIONS

This application claims priority of EP application 18154475.0 which was filed on Jan. 31, 2018 and which is incorporated herein in its entirety by reference.

FIELD

The present invention relates to a two-dimensional diffraction grating for a phase-stepping measurement system for determining an aberration map for a projection system and to methods for designing such a two-dimensional diffraction grating. In particular, the present invention relates to a two-dimensional diffraction grating for a shearing phase-stepping interferometric measurement system.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Radiation that has been patterned by the patterning device is focussed onto the substrate using a projection system. The projection system may introduce optical aberrations, which cause the image formed on the substrate to deviate from a desired image (for example a diffraction limited image of the patterning device).

It may be desirable to provide methods and apparatus for accurately determining such aberrations caused by a projection system such that these aberrations can be better controlled.

SUMMARY

According to a first aspect of the invention there is provided a two-dimensional diffraction grating for a phase-stepping measurement system for determining an aberration map for a projection system, the diffraction grating comprising a substrate provided with a square array of through-apertures, wherein the diffraction grating is self-supporting.

It will be appreciated that for a substrate provided with a square array of through-apertures to be self-supporting at least some substrate material is provided between each through-aperture and the adjacent through apertures.

Since the two-dimensional diffraction grating is self-supporting it does not need, for example a transmissive supporting layer. Therefore the first aspect of the invention is particularly beneficial for use in a phase-stepping measurement system for determining an aberration map for a projection system that uses EUV radiation since the use of such a transmissive supporting layer would significantly reduce the amount of EUV radiation that is transmitted by the two-dimensional diffraction grating.

The substrate may comprise: a support layer; and a radiation absorbing layer, and the through-apertures may extend through both the support layer and the radiation absorbing layer.

The support layer may, for example, be formed from SiN. The radiation absorbing layer may, for example, be formed from a metal such as, for example, chromium (Cr), nickel (Ni) or cobalt (Co).

The geometry of the two-dimensional diffraction grating may be arranged to result in a grating efficiency map that reduces the number of contributions above a threshold to a harmonic of a phase stepping signal assuming that the two-dimensional diffraction grating will be used with a first patterned region that comprises a one-dimensional diffraction grating with a 50% duty cycle.

The harmonic may be the first harmonic of the phase stepping signal.

The geometry of the two-dimensional diffraction grating may be arranged to result in a grating efficiency map that reduces the number of contributions above a threshold to a harmonic of a phase stepping signal assuming that the two-dimensional diffraction grating will be used with a first patterned region that comprises a two-dimensional checkerboard diffraction grating with a 50% duty cycle.

The harmonic may be the first harmonic of the phase stepping signal.

It will be appreciated that a phase-stepping measurement system (or a phase-stepping lateral shearing interferometric measurement system) for determining an aberration map for a projection system generally comprises a first grating, or patterned region, disposed in an object plane of the projection system and a sensor apparatus comprising a second grating or patterned region disposed in an image plane of the projection system. Diffraction beams generated by the first grating may be referred to as first diffraction beams and diffraction beams generated by the second grating may be referred to as second diffraction beams.

The pitches of the first and second patterned regions are matched in a shearing direction, taking into account any reduction factor applied by the projection system, such that the pitch of the second patterned region (which may be in accordance with the first aspect) in said shearing direction is an integer multiple of the pitch of the first patterned region in said shearing direction or, alternatively, the pitch of the first patterned region in said shearing direction should be an integer multiple of the pitch of the second patterned region in said shearing direction.

At least one of the first and second patterned regions are moved in a shearing direction such that an intensity of radiation received by each part of the radiation detector varies as a function of the movement in the shearing direction so as to form an oscillating signal (also known as a phase stepping signal).

For example, the first harmonic of such an oscillating phase-stepping signal only depends on contributions that arise from the interference between spatially coherent diffraction beams (of the two-dimensional diffraction grating) that originate from diffraction beams of the first patterned region that differ in order by ±1.

The geometry of the two-dimensional diffraction grating may be arranged to result in a grating efficiency map that suppresses grating efficiencies of the $(n, m)^{th}$ diffraction orders where either n or m is a non-zero even number.

Such a grating geometry is suitable for use with a first patterned region with the shearing and non-shearing directions defined by said first patterned region being disposed at 45° to a unit cell of the two-dimensional grating, the first patterned region having a pitch (taking into account any reduction factor applied by the projection system) that is half that of a pitch of the two-dimensional diffraction grating in said shearing direction (which may be referred to as a pseudo-pitch of the two-dimensional grating) so as to limit the number of significant contributions to the first harmonic the oscillating phase-stepping signal.

Again assuming a first patterned region comprising a one-dimensional diffraction grating with a 50% duty cycle, the interference strengths for all pairs of second diffraction beams that contribute to the first harmonic of the oscillating phase-stepping signal can be determined by overlaying a second copy of the scattering efficiency plot for the two-dimensional diffraction grating weighted by the scattering efficiency for the $\pm 1^{st}$ order diffraction beams of the first patterned region with the scattering efficiency plot for the second patterned region. Again, this copy is shifted in the shearing direction by 1 diffraction order of the first diffraction grating, which is equal to 2 pseudo-diffraction orders (in the shearing direction, the pseudo-diffraction orders being defined using the pseudo pitch) of the two-dimensional diffraction grating.

In the limit that the grating efficiencies of the $(n, m)^{th}$ diffraction orders are zero where either n or m is a non-zero even number there are only four interference contributions to the first harmonic of the oscillating phase-stepping signal.

The through-apertures may be are square apertures having a length that is half the distance between the centres of adjacent through-apertures, the sides of the square apertures being parallel to the axes of the square array of through-apertures.

This grating geometry may be referred to as a Gingham pattern. Such a geometry results in the grating efficiencies of the $(n, m)^{th}$ diffraction orders being zero where either n or m is a non-zero even number. When the unit cell of such a two-dimensional grating is disposed at 45° to a shearing direction defined by a first patterned region, the first patterned region having a pitch (taking into account any reduction factor applied by the projection system) that is half that of a pitch of the two-dimensional diffraction grating in said shearing direction, there are only four interference contributions to the first harmonic of the oscillating phase-stepping signal.

The geometry of the two-dimensional diffraction grating may be arranged to result in a grating efficiency map that suppresses grating efficiencies of the $(n, m)^{th}$ diffraction orders wherein n±m is an even number except the $(0, 0)^{th}$ diffraction order.

A two-dimensional diffraction grating that comprises a checkerboard grating has a diffraction efficiency pattern wherein the grating efficiency of the $(n, m)^{th}$ diffraction orders are zero when n±m is an even number. When used with a first patterned region that comprises a one-dimensional diffraction grating with a 50% duty cycle, this results in a particularly advantageous phase-stepping measurement system wherein there are only two contributions to the first harmonic of the phase stepping signal, the two contributions having the same interference strengths.

It will be appreciated that, due to mechanical and thermal considerations, it may be desirable to provide an alternative general geometry for the two-dimensional diffraction grating. However, by selecting values for the least one parameter that minimise grating efficiencies for one or more $(n, m)^{th}$ diffraction orders wherein n±m is an even number, the grating efficiency of one or more diffraction orders that would be zero for a checkerboard grating are minimised.

The through-apertures may be generally octagonal, being formed from a square that is orientated at 45° to the axes of the square array of through-apertures and having a diagonal dimension that matches a distance between the centres of adjacent through-apertures, each of the four corners of the square having been truncated so as to form a generally rectangular connecting portion of the substrate between each pair of adjacent through apertures.

This provides an arrangement that is similar to a checkerboard grating but wherein connecting portions or side-bars are provided to ensure that the grating is self-supporting.

It will be appreciated that the dimensions of such connecting portions that are required so as to ensure that the grating is self-supporting may be dependent on the thickness of the substrate.

A width of the generally rectangular connecting portion of the substrate between each pair of adjacent through apertures may be approximately 10% of the distance between the centres of adjacent through-apertures.

For example, the width of the generally rectangular connecting portion of the substrate between each pair of adjacent through apertures may be between 5% and 15% of the distance between the centres of adjacent through-apertures, for example, between 8% and 12% of the distance between the centres of adjacent through-apertures.

The geometry of the two-dimensional diffraction grating may be arranged to result in a grating efficiency map that suppresses a grating efficiency of one or more diffraction orders, the one or more diffraction orders being the $(n, m)^{th}$ diffraction orders wherein n±m is an even number.

The geometry of the two-dimensional diffraction grating may be arranged to suppress the (±2, 0) and (0,±2) diffraction orders. For example, the through apertures in the square array may be circular and a ratio of the radius of the circular apertures to the distance between the centres of adjacent apertures may be approximately 0.3.

The geometry of the two-dimensional diffraction grating may be arranged to suppress the (±1, ±1)diffraction orders. For example, the through apertures in the square array may be circular and a ratio of the radius of the circular apertures to the distance between the centres of adjacent apertures may be approximately 0.43.

According to a second aspect of the invention there is provided a method of designing a two-dimensional diffraction grating for a phase-stepping measurement system for determining an aberration map for a projection system, the method comprising: selecting a general geometry for the two-dimensional diffraction grating, the general geometry having at least one parameter; and selecting values for the least one parameter that result in a grating efficiency map for the two-dimensional diffraction grating so as to control the contributions to a harmonic of a phase stepping signal.

The method according to the second aspect of the invention allows the geometry of the two-dimensional diffraction grating to be varied so as to control the contributions to the harmonic of a phase stepping signal. The harmonic may be the first harmonic of the phase stepping signal. For example, for a given general geometry, it may be desirable to generally reduce the number of contributions to a harmonic (for example the first harmonic) of the phase stepping signal. Additionally or alternatively, it may be desirable to enhance certain contributions to a harmonic (for example the first harmonic) of a phase stepping signal and/or to suppress certain contributions to the first harmonic of a phase stepping signal.

It will be appreciated that a phase-stepping measurement system for determining an aberration map for a projection system generally comprises a first grating, or patterned region, disposed in an object plane of the projection system and a sensor apparatus comprising a second grating or patterned region disposed in an image plane of the projection system. Diffraction beams generated by the first grating may be referred to as first diffraction beams, and may be angularly separated in a shearing direction, and diffraction beams generated by the second grating may be referred to as second diffraction beams.

The pitches of the first and second patterned regions are matched, taking into account any reduction factor applied by the projection system, such that the pitch of the second patterned region (which may be designed using a method according to the second aspect) in the shearing direction is an integer multiple of the pitch of the first patterned region in the shearing direction or, alternatively, the pitch of the first patterned region in the shearing direction should be an integer multiple of the pitch of the second patterned region in the shearing direction.

At least one of the first and second patterned regions are moved in a shearing direction such that an intensity of radiation received by each part of the radiation detector varies as a function of the movement in the shearing direction so as to form an oscillating signal (also known as a phase stepping signal).

For example, the first harmonic of such an oscillating phase-stepping signal only depends on contributions that arise from the interference between spatially coherent diffraction beams (of the two-dimensional diffraction grating) that originate from diffraction beams of the first patterned region that differ in order by ±1. Therefore, it will be appreciated that the method according to the second aspect will, in general, take into account the geometry of a first patterned region.

The selection of values for the at least one parameter that result in a grating efficiency map for the two-dimensional diffraction grating so as to control the contributions to a harmonic of a phase stepping signal may assume that the two-dimensional diffraction grating will be used with a first patterned region that comprises a one-dimensional diffraction grating with a 50% duty cycle.

With such a first patterned region, the efficiencies of the even diffraction orders (except the 0th diffraction order) are zero. Therefore, the only two pairs of first diffraction beams that differ in order by ±1 (and therefore contribute to the first harmonic of such an oscillating phase-stepping signal) are the $0^{th}$ order beam with either the $±1^{st}$ order beams. Furthermore, with this geometry for the first patterned region, the scattering efficiencies are symmetric such that the efficiencies of the $±1^{st}$ order diffraction beams are both the same. Therefore, the interference strengths $\gamma_i$ for all pairs of second diffraction beams that contribute to the first harmonic of the oscillating phase-stepping signal can be determined as follows. A second copy of the scattering efficiency plot for the second patterned region weighted by the scattering efficiency for the $±1^{st}$ order diffraction beams of the first patterned region is overlaid with the scattering efficiency plot for the second patterned region but shifted in the shearing direction by 1 diffraction order (of the first diffraction grating). The product of the scattering efficiencies of these two overlaid scattering efficiencies plots is then determined.

The method according to the second aspect of the invention may involve the selection of values for the least one parameter that result in a grating efficiency map for the two-dimensional diffraction grating so as to control these interference strengths. For example, the values for the least one parameter may be selected to reduce the number of interference strengths that are above a threshold value; to enhance (i.e. increase) certain interference strengths; and/or to suppress (i.e. reduce) certain interference strengths.

Alternatively, the selection of values for the least one parameter that result in a grating efficiency map for the two-dimensional diffraction grating so as to control the contributions to a harmonic of a phase stepping signal may assume that the two-dimensional diffraction grating will be used with a first patterned region that comprises a two-dimensional checkerboard diffraction grating with a 50% duty cycle.

The selection of the general geometry for the two-dimensional diffraction grating may take into account mechanical and thermal considerations.

The general geometry for the two-dimensional diffraction grating that is selected may be chosen such that the two-dimensional diffraction grating comprises a substrate provided with a square array of through-apertures and wherein the two-dimensional diffraction grating is self-supporting.

Since the two-dimensional diffraction grating is self-supporting it does not need, for example a transmissive supporting layer. Such an arrangement may be beneficial for use in a phase-stepping measurement system for determining an aberration map for a projection system that uses EUV radiation since the use of such a transmissive supporting layer would reduce the amount of EUV radiation that is transmitted by the two-dimensional diffraction grating.

It will be appreciated that for a substrate provided with a square array of through-apertures to be self-supporting at least some substrate material is provided between each through-aperture and the adjacent through apertures.

In addition, the general geometry for the two-dimensional diffraction grating that is selected may be chosen such that the amount of substrate material provided between each through-aperture and the adjacent through apertures is sufficiently large to allow a heat load expected during use to be drained without damaging the two-dimensional diffraction grating.

The general geometry for the two-dimensional diffraction grating that is selected may be a square array of circular apertures and the at least one parameter comprises a ratio of the radius of the circular apertures to the distance between the centres of adjacent apertures.

The step of selecting values for the least one parameter may involve selecting values for the least one parameter that minimises a grating efficiency of one or more diffraction orders, the one or more diffraction orders being the $(n, m)^{th}$ diffraction orders wherein n±m is an even number.

A two-dimensional diffraction grating that comprises a checkerboard grating has a diffraction efficiency pattern wherein the grating efficiency of the $(n, m)^{th}$ diffraction orders are zero when n±m is an even number. When used with a first patterned region that comprises a one-dimensional diffraction grating with a 50% duty cycle, this results in a particularly advantageous a phase-stepping measurement system wherein there are only two contributions to the first harmonic of the phase stepping signal, the two contributions having the same interference strengths.

It will be appreciated that, due to mechanical and thermal considerations, it may be desirable to provide an alternative general geometry for the two-dimensional diffraction grating. However, by selecting values for the least one parameter that minimise grating efficiencies for one or more (n, m)$^{th}$ diffraction orders wherein n±m is an even number, the grating efficiency of one or more diffraction orders that would be zero for a checkerboard grating are minimised.

The step of selecting values for the least one parameter may involve selecting values for the least one parameter that minimises a grating efficiency of the (±2, 0) and (0,±2) diffraction orders. For example, the step of selecting values for the least one parameter may involve selecting a value of the ratio of the radius of the circular apertures to the distance between the centres of adjacent apertures is approximately 0.3.

The step of selecting values for the least one parameter may involve selecting values for the least one parameter that minimises a grating efficiency of the (±1, ±1)diffraction orders. For example, the step of selecting values for the least one parameter may involve selecting a value of the ratio of the radius of the circular apertures to the distance between the centres of adjacent apertures is approximately 0.43.

According to a third aspect of the invention there is provided a two-dimensional diffraction grating designed according to the method the second aspect of the invention.

According to a fourth aspect of the invention there is provided a measurement system for determining an aberration map for a projection system, the measurement system comprising: a patterning device; an illumination system arranged to illuminate the patterning device with radiation, the patterning device comprising a first patterned region arranged to receive a radiation beam and to form a plurality of first diffraction beams, the first diffraction beams being separated in a shearing direction; a sensor apparatus comprising a second patterned region, the second patterned region comprising a two-dimensional diffraction grating according to the first aspect of the invention or the third aspect of the invention, and a radiation detector; the projection system being configured to project the first diffraction beams onto the sensor apparatus, the second patterned region being arranged to receive the first diffraction beams from the projection system and to form a plurality of second diffraction beams from each of the first diffraction beams; a positioning apparatus configured to move at least one of the patterning device and the sensor apparatus in the shearing direction; and a controller configured to: control the positioning apparatus so as to move at least one of the first patterning device and the sensor apparatus in the shearing direction such that an intensity of radiation received by each part of the radiation detector varies as a function of the movement in the shearing direction so as to form an oscillating signal; determine from the radiation detector a phase of a harmonic of the oscillating signal at a plurality of positions on the radiation detector; and determine a set of coefficients that characterize the aberration map of the projection system from the phase of a harmonic of the oscillating signal at the plurality of positions on the radiation detector.

The measurement system according to the fourth aspect of the invention is advantageous, particularly for a projection system that uses EUV radiation, because the two-dimensional diffraction grating is self-supporting (and therefore does not require a transmissive supporting layer that would significantly attenuate the EUV radiation) and/or it provides better control the contributions to a harmonic (for example the first harmonic) of a phase stepping signal.

Therefore, the measurement system according to the fourth aspect of the invention can provide a measurement system for determining aberrations for an EUV projection system which can provide better control over contributions to the first harmonic of the phase stepping signal. In turn, this can reduce errors in the determined set of coefficients that characterize the aberration map of the projection system. Additionally or alternatively, it may simplify the determination of the set of coefficients that characterize the aberration map of the projection system from the phase of a first harmonic of the oscillating signal at the plurality of positions on the radiation detector.

According to a fifth aspect of the invention there is provided a lithographic apparatus comprising the measurement system of the fourth aspect of the invention.

BRIEF DESCRIPTION OF THE DRAWINGS

Embodiments of the invention will now be described, by way of example only, with reference to the accompanying schematic drawings, in which:

FIG. 6A shows the scattering efficiency for one dimensional diffraction grating with a 50% duty cycle and which may represent the first patterned region of the measurement system shown in FIG. 4;

FIG. 6B shows the scattering efficiency for two dimensional diffraction grating of the form of a checkerboard with a 50% duty cycle and which may represent the second patterned region of the measurement system shown in FIG. 4;

FIG. 6C shows an interference strength map for the measurement system shown in FIG. 4 when employing the first patterned region shown in FIG. 6A and the second patterned region shown in FIG. 6B, each of the interference strengths shown representing the second interference beams which contribute to the first harmonic of the oscillating phase-stepping signal and which have a different overlap, at the radiation detector, with a circle that represents the numerical aperture of the projection system PS;

FIG. 17A shows the scattering efficiency for one dimensional diffraction grating with a 50% duty cycle and which may represent the first patterned region of the measurement system shown in FIG. 4;

FIG. 17B shows the scattering efficiency for a two dimensional diffraction comprising the unit shown in FIG. 14 and which may represent the second patterned region of the measurement system shown in FIG. 4;

FIG. 17C shows an interference strength map for the measurement system shown in FIG. 4 when employing the first patterned region shown in FIG. 17A and the second patterned region shown in FIG. 17B, each of the interference strengths shown representing the second interference beams which contribute to the first harmonic of the oscillating phase-stepping signal and which have a different overlap, at the radiation detector, with a circle that represents the numerical aperture of the projection system;

DETAILED DESCRIPTION

Figure 1:
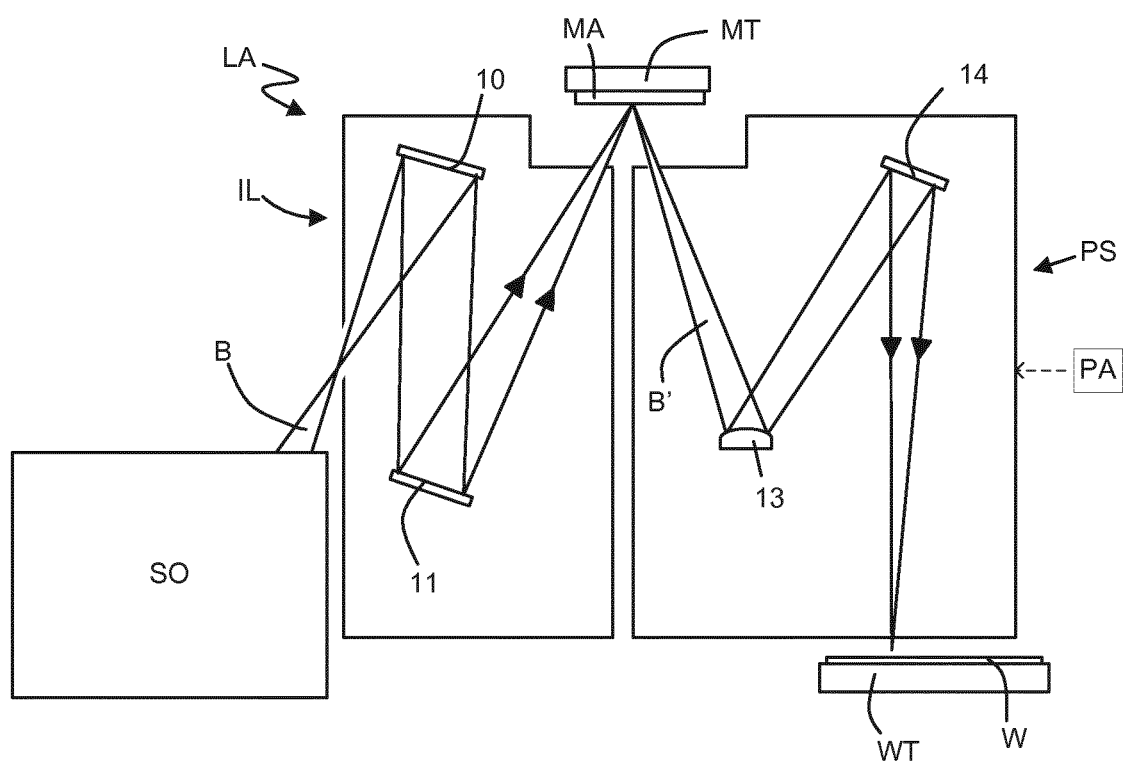
FIG. 1 depicts a lithographic system comprising a lithographic apparatus and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction a patterned EUV radiation beam B' is generated. The projection system PS is configured to project the patterned EUV radiation beam B' onto the substrate W. For that purpose, the projection system PS may comprise a plurality of mirrors 13, 14 which are configured to project the patterned EUV radiation beam B' onto the substrate W held by the substrate table WT. The projection system PS may apply a reduction factor to the patterned EUV radiation beam B' thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

In general, the projection system PS has an optical transfer function which may be non-uniform, which can affect the pattern which is imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be obtained from a measured scalar map by calculating the inner product of the measured scalar map with each Zernike polynomial in turn and dividing this by the square of the norm of that Zernike polynomial. In the following, unless stated otherwise, any reference to Zernike coefficients will be understood to mean the Zernike coefficients of a relative phase map (also referred to herein as an aberration map). It will be appreciated that in alternative embodiments other sets of basis functions may be used. For example some embodiments may use Tatian Zernike polynomials, for example for obscured aperture systems.

The wavefront aberration map represents the distortions of the wavefront of light approaching a point in an image plane of the projection system PS from a spherical wavefront (as a function of position in the pupil plane or, alternatively, the angle at which radiation approaches the image plane of the projection system PS). As discussed, this wavefront aberration map $W(x, y)$ may be expressed as a linear combination of Zernike polynomials:

$$W(x, y) = \sum_n c_n \cdot Z_n(x, y) \qquad (1)$$

where x and y are coordinates in the pupil plane, $Z_n(x, y)$ is the nth Zernike polynomial and $c_n$ is a coefficient. It will be appreciated that in the following, Zernike polynomials and coefficients are labelled with an index which is commonly referred to as a Noll index. Therefore, $Z_n(x, y)$ is the Zernike polynomial having a Noll index of n and $c_n$ is a coefficient having a Noll index of n. The wavefront aberration map may then be characterized by the set of coefficients $c_n$ in such an expansion, which may be referred to as Zernike coefficients.

It will be appreciated that only a finite number of Zernike orders are taken into account. Different Zernike coefficients of the phase map may provide information about different forms of aberration which are caused by the projection system PS. The Zernike coefficient having a Noll index of 1 may be referred to as the first Zernike coefficient, the Zernike coefficient having a Noll index of 2 may be referred to as the second Zernike coefficient and so on.

The first Zernike coefficient relates to a mean value (which may be referred to as a piston) of a measured wavefront. The first Zernike coefficient may be irrelevant to the performance of the projection system PS and as such may not be determined using the methods described herein. The second Zernike coefficient relates to the tilt of a measured wavefront in the x-direction. The tilt of a wavefront in the x-direction is equivalent to a placement in the x-direction. The third Zernike coefficient relates to the tilt of a measured wavefront in the y-direction. The tilt of a wavefront in the y-direction is equivalent to a placement in the y-direction. The fourth Zernike coefficient relates to a defocus of a measured wavefront. The fourth Zernike coefficient is equivalent to a placement in the z-direction. Higher order Zernike coefficients relate to other forms of aberration which are caused by the projection system (e.g. astigmatism, coma, spherical aberrations and other effects).

Throughout this description the term "aberrations" should be intended to include all forms of deviation of a wavefront from a perfect spherical wavefront. That is, the term "aberrations" may relate to the placement of an image (e.g. the second, third and fourth Zernike coefficients) and/or to higher order aberrations such as those which relate to Zernike coefficients having a Noll index of 5 or more. Furthermore, any reference to an aberration map for a projection system may include all forms of deviation of a wavefront from a perfect spherical wavefront, including those due to image placement.

The transmission map and the relative phase map are field and system dependent. That is, in general, each projection system PS will have a different Zernike expansion for each field point (i.e. for each spatial location in its image plane).

As will be described in further detail below, the relative phase of the projection system PS in its pupil plane may be determined by projecting radiation from an object plane of the projection system PS (i.e. the plane of the patterning device MA), through the projection system PS and using a shearing interferometer to measure a wavefront (i.e. a locus of points with the same phase). The shearing interferometer may comprise a diffraction grating, for example a two dimensional diffraction grating, in an image plane of the projection system (i.e. the substrate table WT) and a detector arranged to detect an interference pattern in a plane that is conjugate to a pupil plane of the projection system PS.

The projection system PS comprises a plurality of optical elements (including mirrors 13, 14). As already explained, although the projection system PS is illustrated as having only two mirrors 13, 14 in FIG. 1, the projection system PS may include a different number of mirrors (e.g. six or eight mirrors). The lithographic apparatus LA further comprises adjusting means PA for adjusting these optical elements so as to correct for aberrations (any type of phase variation across the pupil plane throughout the field). To achieve this, the adjusting means PA may be operable to manipulate optical elements within the projection system PS in one or more different ways. The projection system may have a co-ordinate system wherein its optical axis extends in the z direction (it will be appreciated that the direction of this z axis changes along the optical path through the projection system, for example at each mirror or optical element). The adjusting means PA may be operable to do any combination of the following: displace one or more optical elements; tilt one or more optical elements; and/or deform one or more optical elements. Displacement of optical elements may be in any direction (x, y, z or a combination thereof). Tilting of optical elements is typically out of a plane perpendicular to the optical axis, by rotating about axes in the x or y directions although a rotation about the z axis may be used for non-rotationally symmetric optical elements. Deformation of an optical element may be performed for example by using actuators to exert force on sides of the optical element and/or by using heating elements to heat selected regions of the optical element. In general, it may not be possible to adjust the projection system PS to correct for apodizations (transmission variation across the pupil plane). The transmission map of a projection system PS may be used when designing masks MAs for the lithographic apparatus LA.

In some embodiments, the adjusting means PA may be operable to move the support structure MT and/or the substrate table WT. The adjusting means PA may be operable to displace (in any of the x, y, z directions or a combination thereof) and/or tilt (by rotating about axes in the x or y directions) the support structure MT and/or the substrate table WT.

A projection system PS which forms part of a lithographic apparatus may periodically undergo a calibration process. For example, when a lithographic apparatus is manufactured in a factory the optical elements (e.g. mirrors) which form the projection system PS may be set up by performing an initial calibration process. After installation of a lithographic apparatus at a site at which the lithographic apparatus is to be used, the projection system PS may once again be calibrated. Further calibrations of the projection system PS may be performed at regular intervals. For example, under normal use the projections system PS may be calibrated every few months (e.g. every three months).

Calibrating a projection system PS may comprise passing radiation through the projection system PS and measuring the resultant projected radiation. Measurements of the projected radiation may be used to determine aberrations in the projected radiation which are caused by the projection system PS. Aberrations which are caused by the projection system PS may be determined using a measurement system. In response to the determined aberrations, the optical elements which form the projection system PS may be adjusted so as to correct for the aberrations which are caused by the projection system PS.

Figure 2:
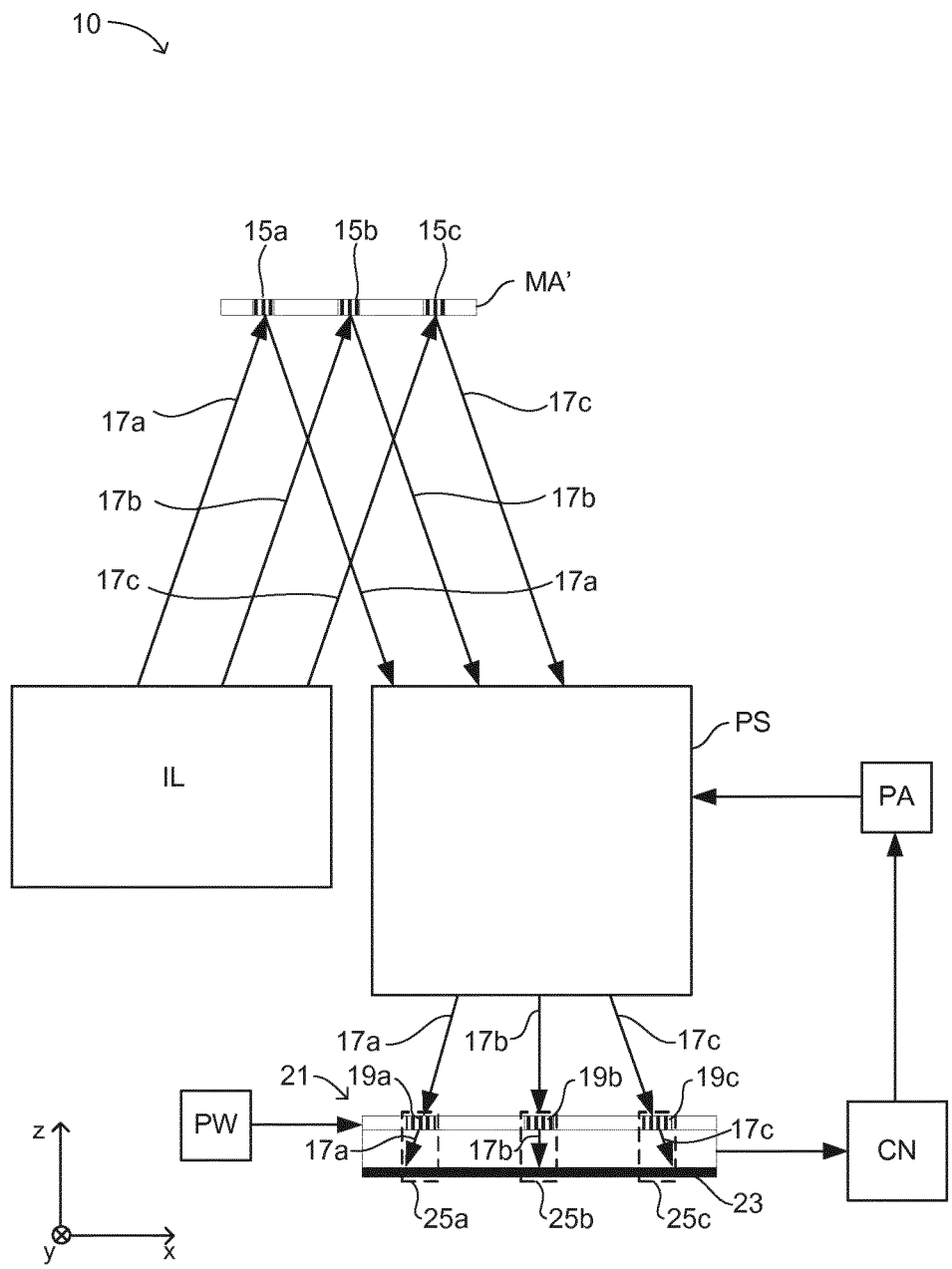
FIG. 2 is a schematic illustration of a measurement system according to an embodiment of the invention.

FIG. 2 is a schematic illustration of a measurement system 10 which may be used to determine aberrations which are caused by a projection system PS. The measurement system 10 comprises an illumination system IL, a measurement patterning device MA', a sensor apparatus 21 and a controller CN. The measurement system 10 may form part of a lithographic apparatus. For example, the illumination system IL and the projection system PS which are shown in FIG. 2 may be the illumination system IL and projection system PS of the lithographic apparatus which is shown in FIG. 1. For ease of illustration additional components of a lithographic apparatus are not shown in FIG. 2.

The measurement patterning device MA' is arranged to receive radiation from the illumination system IL. The sensor apparatus 21 is arranged to receive radiation from the projection system PS. During normal use of a lithographic apparatus, the measurement patterning device MA' and the sensor apparatus 21 which are shown in FIG. 2 may be located in positions that are different to the positions in which they are shown in FIG. 2. For example, during normal use of a lithographic apparatus a patterning device MA which is configured to form a pattern to be transferred to a substrate W may be positioned to receive radiation from the illumination system IL and a substrate W may be positioned to receive radiation from the projection system PS (as is shown, for example, in FIG. 1). The measurement patterning device MA' and the sensor apparatus 21 may be moved into the positions in which they are shown in FIG. 2 in order to determine aberrations which are caused by the projection system PS. The measurement patterning device MA' may be supported by a support structure MT, such as the support structure which is shown in FIG. 1. The sensor apparatus 21 may be supported by a substrate table, such as the substrate table WT which is shown in FIG. 1. Alternatively the sensor apparatus 21 may be supported by a measurement table (not shown) which may be separate to the substrate table WT.

Figure 3A:
FIGS. 3A and 3B are schematic illustrations of a patterning device and a sensor apparatus which may form part of the measurement system of FIG. 2.
Figure 3B:
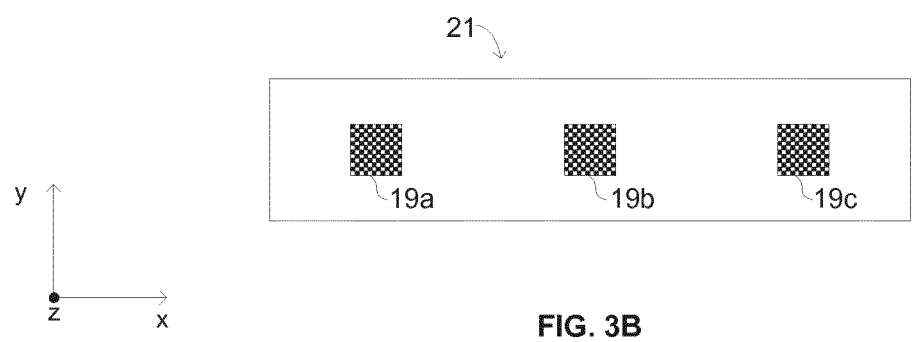

The measurement patterning device MA' and the sensor apparatus 21 are shown in more detail in FIGS. 3A and 3B. Cartesian co-ordinates are used consistently in FIGS. 2, 3A and 3B. FIG. 3A is a schematic illustration of the measurement patterning device MA' in an x-y plane and FIG. 3B is a schematic illustration of the sensor apparatus 21 in an x-y plane.

The measurement patterning device MA' comprises a plurality of patterned regions 15a-15c. In the embodiment which is shown in FIGS. 2 and 3A the measurement patterning device MA' is a reflective patterning device MA'. The patterned regions 15a-15c each comprises a reflective diffraction grating. Radiation which is incident on the patterned regions 15a-15c of the measurement patterning device MA' is at least partially scattered by thereby and received by the projection system PS. In contrast, radiation which is incident on the remainder of the measurement patterning device MA' is not reflected or scattered towards the projection system PS (for example, it may be absorbed by the measurement patterning device MA').

The illumination system IL illuminates the measurement patterning device MA' with radiation. Whilst not shown in FIG. 2, the illumination system IL may receive radiation from a radiation source SO and condition the radiation so as to illuminate the measurement patterning device MA'. For example, the illumination system IL may condition the radiation so as to provide radiation having a desired spatial and angular distribution. In the embodiment which is shown in FIG. 2, the illumination system IL is configured to form separate measurement beams 17a-17c. Each measurement beam 17a-17c illuminates a respective patterned region 15a-15c of the measurement patterning device MA'.

In order to perform a determination of aberrations which are caused by the projection system PL, a mode of the illumination system IL may be changed in order to illuminate the measurement patterning device MA' with separate measurement beams 17a-17c. For example, during normal operation of a lithographic apparatus, the illumination system IL may be configured to illuminate a patterning device MA with a slit of radiation. However the mode of the illumination system IL may be changed such that the illumination system IL is configured to form separate measurement beams 17a-17c in order to perform a determination of aberrations caused by the projection system PL. In some embodiments different patterned regions 15a-15c may be illuminated at different times. For example, a first subset of the patterned regions 15a-15c may be illuminated at a first time so as to form a first subset of measurement beams 17a-17c and a second subset of patterned regions 15a-15c may be illuminated at a second time so as to form a second subset of measurement beams 17a-17c.

In other embodiments the mode of the illumination system IL may be unchanged in order to perform a determination of aberrations caused by the projection system PL. For example, the illumination system IL may be configured to illuminate the measurement patterning device MA' with a slit of radiation (e.g. which substantially corresponds with an illumination area used during exposure of substrates). Separate measurement beams 17a-17c may then be formed by the measurement patterning device MA' since only the patterned regions 15a-15c reflect or scatter radiation towards the projection system PS.

In the Figures the Cartesian co-ordinate system is shown as being conserved through the projection system PS. However, in some embodiments the properties of the projection system PS may lead to a transformation of the co-ordinate system. For example, the projection system PS may form an image of the measurement patterning device MA' which is magnified, rotated and/or mirrored relative to the measurement patterning device MA'. In some embodiments the projection system PS may rotate an image of the measurement patterning device MA' by approximately 180° around the z-axis. In such an embodiment the relative positions of a first measurement beam 17a and a third measurement beam 17c which are shown in FIG. 2, may be swapped. In other embodiments the image may be mirrored about an axis which may lie in an x-y plane. For example, the image may be mirrored about the x-axis or about the y-axis.

In embodiments in which the projection system PS rotates an image of the measurement patterning device MA' and/or the image is mirrored by the projection system PS, the projection system is considered to transform the co-ordinate system. That is, the co-ordinate system which is referred to herein is defined relative to an image which is projected by the projection system PS and any rotation and/or mirroring of the image causes a corresponding rotation and/or mirroring of the co-ordinate system. For ease of illustration, the co-ordinate system is shown in the Figures as being conserved by the projection system PS. However, in some embodiments the co-ordinate system may be transformed by the projection system PS.

The patterned regions 15a-15c modify the measurement beams 17a-17c. In particular, the patterned regions 15a-15c cause a spatial modulation of the measurement beams 17a-17c and cause diffraction in the measurement beams 17a-17c. In the embodiment which is shown in FIG. 3B the patterned regions 15a-15c each comprise two distinct portions. For example, a first patterned region 15a comprises a first portion 15a' and a second portion 15a". The first portion 15a' comprises a diffraction grating which is aligned parallel to a u-direction and the second portion 15a" comprises a diffraction grating which is aligned parallel to a v-direction. The u and v-directions are depicted in FIG. 3A. The u and v-directions are both aligned at approximately 45° relative to both the x and y-directions and are aligned perpendicular to each other. Second 15b and third 15c patterned regions which are shown in FIG. 3A are identical to the first patterned region 15a and each comprise first and second portions whose diffraction gratings are aligned perpendicular to each other.

The first and second portions of the patterned regions 15a-15c may be illuminated with the measurement beams 17a-17c at different times. For example, the first portions of each of the patterned regions 15a-15c may be illuminated by the measurement beams 17a-17c at a first time. At a second time the second portions of each of the patterned regions 15a-15c may be illuminated by the measurement beams 17a-17c. As was mentioned above in some embodiments different patterned regions 15a-15c may be illuminated at different times. For example, the first portions of a first subset of patterned regions 15a-15c may be illuminated at a first time and the first portions of a second subset of patterned regions 15a-15c may be illuminated at a second time. Second portions of the first and second subsets of patterned regions may be illuminated at the same or different times. In general any schedule of illuminating different portions of patterned regions 15a-15c may be used.

The modified measurement beams 17a-17c are received by the projection system PS. The projection system PS forms an image of the patterned regions 15a-15c on the sensor apparatus 21. The sensor apparatus 21 comprises a plurality of diffraction gratings 19a-19c and a radiation detector 23. The diffraction gratings 19a-19c are arranged such that each diffraction grating 19a-19c receives a respective modified measurement beam 17a-17c which is output from the projection system PL. The modified measurement beams 17a-17c which are incident on the diffraction gratings 19a-19c are further modified by the diffraction gratings 19a-19c. The modified measurement beams which are transmitted at the diffraction gratings 19a-19c are incident on the radiation detector 23.

The radiation detector 23 is configured to detect the spatial intensity profile of radiation which is incident on the radiation detector 23. The radiation detector 23 may, for example, comprise an array of individual detector elements or sensing elements. For example, the radiation detector 23 may comprise an active pixel sensor such as, for example, a CMOS (complementary metal-oxide-semiconductor) sensor array. Alternatively, the radiation detector 23 may comprise a CCD (charge-coupled device) sensor array. The diffraction gratings 19a-19c and portions of the radiation sensor 23 at which the modified measurement beams 17a-17c are received form detector regions 25a-25c. For example, a first diffraction grating 19a and a first portion of the radiation sensor 23 at which a first measurement beam 17a is received together form a first detector region 25a. A measurement of a given measurement beam 17a-17c may be made at a respective detector region 25a-25c (as depicted). As was described above, in some embodiments the relative positioning of the modified measurement beams 17a-17c and the co-ordinate system may be transformed by the projection system PS.

The modification of the measurement beams 17a-17c which occurs at the patterned regions 15a-15c and the diffraction gratings 19a-19c of the detector regions 25a-25c results in interference patterns being formed on the radiation detector 23. The interference patterns are related to the derivative of the phase of the measurement beams and depend on aberrations caused by the projection system PS. The interference patterns may therefore be used to determine aberrations which are caused by the projection system PS.

In general, the diffraction gratings 19a-19c of each of the detector regions 25a-25c comprises a two-dimensional transmissive diffraction grating. In the embodiment which is shown in FIG. 3B the detector regions 25a-25c each comprise a diffraction grating 19a-19c which is configured in the form of a checkerboard. As described further below, embodiments of the present invention have particular application to arrangements where the detector regions 25a-25c each comprises a two-dimensional transmissive diffraction grating 19a-19c that is not configured in the form of a checkerboard.

Illumination of the first portions of the patterned regions 15a-15c may provide information related to aberrations in a first direction and illumination of the second portions of the patterned regions 15a-15c may provide information related to aberrations in a second direction.

In some embodiments, the measurement patterning device MA' and/or the sensor apparatus 21 is sequentially scanned and/or stepped in two perpendicular directions. For example, the measurement patterning device MA' and/or the sensor apparatus 21 may be stepped relative to each other in the u and v-directions. The measurement patterning device MA' and/or the sensor apparatus 21 may be stepped in the u-direction whilst the second portions 15a''-15c'' of the patterned regions 15a-15c are illuminated and the measurement patterning device MA' and/or the sensor apparatus 21 may be stepped in the v-direction whilst the first portions 15a'-15c' of the patterned regions 15a-15c are illuminated. That is, the measurement patterning device MA' and/or the sensor apparatus 21 may be stepped in a direction which is perpendicular to the alignment of a diffraction grating which is being illuminated.

The measurement patterning device MA' and/or the sensor apparatus 21 may be stepped by distances which correspond with a fraction of the grating period of the diffraction gratings. Measurements which are made at different stepping positions may be analysed in order to derive information about a wavefront in the stepping direction. For example, the phase of the first harmonic of the measured signal (which may be referred to as a phase stepping signal) may contain information about the derivative of a wavefront in the stepping direction. Stepping the measurement patterning device MA' and/or the sensor apparatus 21 in both the u and v-directions (which are perpendicular to each other) therefore allows information about a wavefront to be derived in two perpendicular directions (in particular, it provides information about a derivative of the wavefront in each of the two perpendicular directions), thereby allowing the full wavefront to be reconstructed.

In addition to stepping of the measurement patterning device MA' and/or the sensor apparatus 21 in a direction which is perpendicular to the alignment of a diffraction grating which is being illuminated (as was described above), the measurement patterning device MA' and/or the sensor apparatus 21 may also be scanned relative to each other. Scanning of the measurement patterning device MA' and/or the sensor apparatus 21 may be performed in a direction which is parallel to the alignment of a diffraction grating which is being illuminated. For example, the measurement patterning device MA' and/or the sensor apparatus 21 may be scanned in the u-direction whilst the first portions 15a'-15c' of the patterned regions 15a-15c are illuminated and the measurement patterning device MA' and/or the sensor apparatus 21 may be scanned in the v-direction whilst the second portions 15a''-15c'' of the patterned regions 15a-15c are illuminated. Scanning of the measurement patterning device MA' and/or the sensor apparatus 21 in a direction which is parallel to the alignment of a diffraction grating which is being illuminated allows measurements to be averaged out across the diffraction grating, thereby accounting for any variations in the diffraction grating in the scanning direction. Scanning of the measurement patterning device MA' and/or the sensor apparatus 21 may be performed at a different time to the stepping of the measurement patterning device MA' and/or the sensor apparatus 21 which was described above.

It will be appreciated that a variety of different arrangements of the patterned regions 15a-15c and the detector regions 25a-25c may be used in order to determine aberrations caused by the projection system PS. The patterned regions 15a-15c and/or the detector regions 25a-25c may comprise diffraction gratings. In some embodiments the patterned regions 15a-15c and/or the detector regions 25a-25c may comprise components other than a diffraction grating. For example, in some embodiments the patterned regions 15a-15c and/or the detector regions may comprise a single slit or a pin-hole opening through which at least a portion of a measurement beam 17a-17c may propagate. In general the patterned regions and/or the detector regions may comprise any arrangement which serves to modify the measurement beams.

The controller CN receives measurements made at the sensor apparatus 21 and determines, from the measurements, aberrations which are caused by the projection system PS. The controller may be configured to control one or more components of the measurement system 10. For example, the controller CN may control a positioning apparatus PW which is operable to move the sensor apparatus 21 and/or the measurement patterning device MA' relative to each other. The controller may control an adjusting means PA for adjusting components of the projection system PS. For example, the adjusting means PA may adjust optical elements of the projection system PS so as to correct for aberrations which are caused by the projection system PS and which are determined by the controller CN.

In some embodiments, the controller CN may be operable to control the adjusting means PA for adjusting the support structure MT and/or the substrate table WT. For example, the adjusting means PA may adjust support structure MT and/or substrate table WT so as to correct for aberrations which are caused by placement errors of patterning device MA and/or substrate W (and which are determined by the controller CN).

Determining aberrations (which may be caused by the projection system PS or by placement errors of the patterning device MA or the substrate W) may comprise fitting the measurements which are made by the sensor apparatus 21 to Zernike polynomials in order to obtain Zernike coefficients. Different Zernike coefficients may provide information about different forms of aberration which are caused by the projection system PS. Zernike coefficients may be determined independently at different positions in the x and/or the y-directions. For example, in the embodiment which is shown in FIGS. 2, 3A and 3B, Zernike coefficients may be determined for each measurement beam 17a-17c.

In some embodiments the measurement patterning device MA' may comprise more than three patterned regions, the sensor apparatus 21 may comprise more than three detector regions and more than three measurement beams may be formed. This may allow the Zernike coefficients to be determined at more positions. In some embodiments the patterned regions and the detector regions may be distributed at different positions in both the x and y-directions. This may allow the Zernike coefficients to be determined at positions which are separated in both the x and the y-directions.

Whilst, in the embodiment which is shown in FIGS. 2, 3A and 3B the measurement patterning device MA' comprises three patterned regions 15a-15c and the sensor apparatus 21 comprises three detector regions 25a-25c, in other embodiments the measurement patterning device MA' may comprise more or less than three patterned regions 15a-15c and/or the sensor apparatus 21 may comprise more or less than three detector regions 25a-25c.

Methods for determining aberrations caused by a projection system PS are now described with reference to FIG. 4.

In general, measurement patterning device MA' comprises at least one first patterned region 15a-15c and the sensor apparatus 21 comprises at least one second patterned region 19a-19c.

Figure 4:
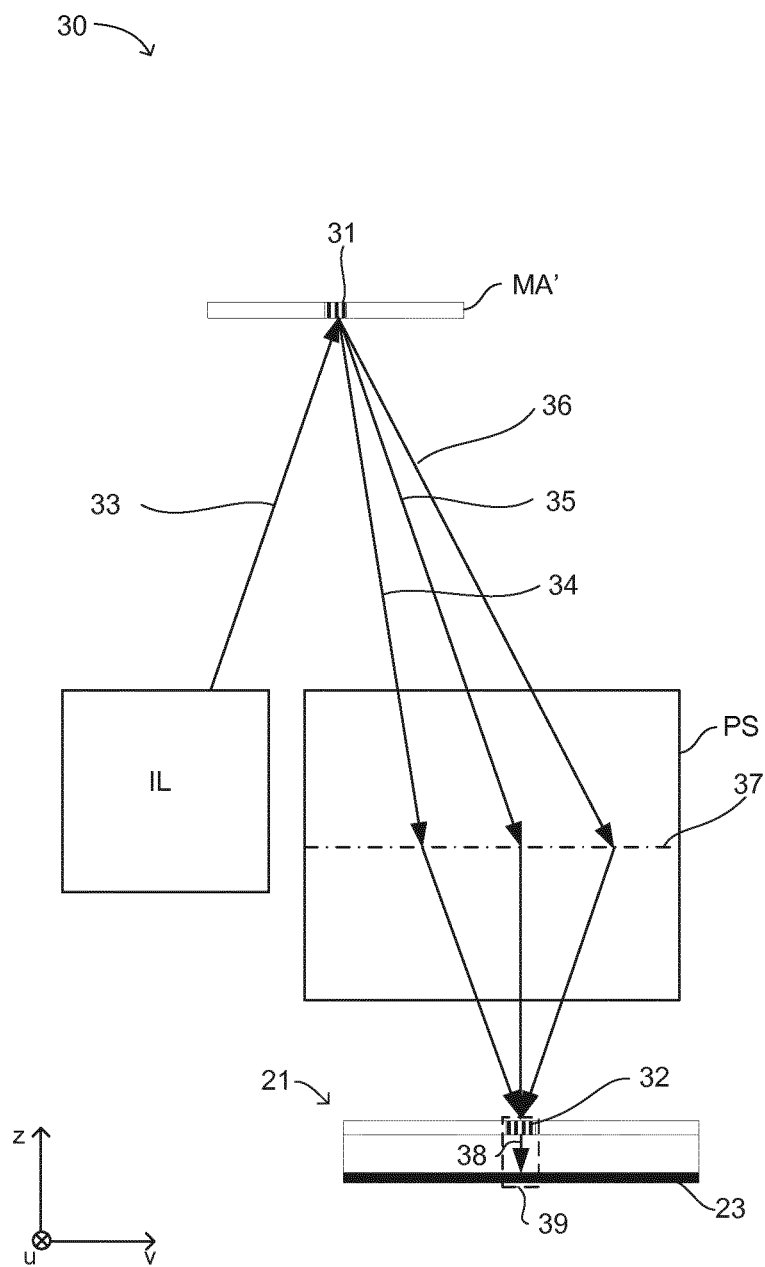
FIG. 4 is a schematic illustration of a measurement system according to an embodiment of the invention, the measurement system comprising a first patterned region and a second patterned region, the first patterned region arranged to receive radiation and to form a plurality of first diffraction beams.

FIG. 4 is a schematic illustration of a measurement system 30 which may be used to determine aberrations which are caused by a projection system PS. Measurement system 30 may be the same as the measurement system 10 shown in FIG. 2, however, it may have a different number of first patterned regions (on measurement patterning device MA') and second patterned regions (in the sensor apparatus 21). Therefore, the measurement system 30 shown in FIG. 4 may include any features of the measurement system 10 shown in FIG. 2 described above and these features will not be further described below.

In FIG. 4, only a single first patterned region 31 is provided on the measurement patterning device MA' and a single second patterned region 32 is provided in the sensor apparatus 21.

The measurement patterning device MA' is irradiated with radiation 33 from the illumination system IL. For ease of understanding only a single line (which may, for example, represent a single ray, for example the chief ray, of an incident radiation beam) is shown in FIG. 4. However, it will be appreciated that the radiation 33 will comprise a range of angles incident on the first patterned region 31 of the measurement patterning device MA'. That is, each point on the first patterned region 31 of the measurement patterning device MA' may be illuminated by a cone of light. In general, each point is illuminated by substantially the same range of angles, this being characterized by the intensity of radiation in a pupil plane of the illumination system IL (not shown).

The first patterned region 31 is arranged to receive the radiation 33 and to form a plurality of first diffraction beams 34, 35, 36. A central first diffraction beam 35 corresponds to a $0^{th}$ order diffraction beam of first patterned region 31 and the other two first diffraction beams 34, 36 correspond to the $\pm 1^{st}$ order diffraction beams of first patterned region 31. It will be appreciated that more, higher order diffraction beams will, in general, also be present. Again for ease of understanding, only three first diffraction beams 34, 35, 36 are shown in FIG. 4.

It will also be appreciated that, as the incoming radiation 33 comprises a cone of radiation converging on a point on the first patterned region 31, each of the first diffraction beams 34, 35, 36 also comprises a cone of radiation diverging from that point on the first patterned region 31.

To achieve the generation of the first diffraction beams 34, 35, 36, the first patterned region 31 may be of the form of a diffraction grating. For example, the first patterned region 31 may be generally of the form of the patterned region 15a shown in FIG. 3A. In particular, at least a portion of the first patterned region 31 may be of the form of the first portion 15a' of the patterned region 15a shown in FIG. 3A, i.e. a diffraction grating which is aligned parallel to a u-direction (note that FIG. 4 is shown in the z-v plane). Therefore, the first diffraction beams 34-36 are separated in a shearing direction, which is the v-direction.

The first diffraction beams 34-36 are at least partially captured by the projection system PS, as now described. How much of the first diffraction beams 34-36 is captured by the projection system PS will be dependent on: the pupil fill of the incident radiation 33 from the illumination system IL; the angular separation of the first diffraction beams 34-36 (which in turn is dependent on the pitch of the first patterned region 31 and the wavelength of the radiation 33); and the numerical aperture of the projection system PS.

The measurement system 30 may be arranged such that first diffraction beam 35 that corresponds to the $0^{th}$ order diffraction beam substantially fills the numerical aperture of the projection system PS, which may be represented by a circular region of a pupil plane 37 of the projection system PS, and the first diffraction beams 34, 36 that correspond to the $\pm 1^{st}$ order diffraction beams overlap significantly with the first diffraction beam 35 that corresponds to the $0^{th}$ order diffraction beam. With such an arrangement, substantially all of the first diffraction beam 35 that corresponds to the $0^{th}$ order diffraction beam and most of the first diffraction beams 34, 36 that correspond to the $\pm 1^{st}$ order diffraction beams is captured by the projection system PS and projected onto the sensor apparatus 21. (Furthermore, with such an arrangement a large number of diffraction beams generated by the first patterned region 31 are at least partially projected onto the sensor apparatus 21).

The role of the first patterned region 31 is to introduce spatial coherence, as now discussed.

In general, two rays of radiation 33 from the illumination system IL that are incident on the same point of the measurement patterning device MA' at different angles of incidence are not coherent. By receiving the radiation 33 and forming a plurality of first diffraction beams 34, 35, 36, the first patterned region 31 may be considered to form a plurality of copies of the incident radiation cone 33 (the copies having, in general different phases and intensities). Within any one of these copies, or first diffraction beams 34, 35, 36, two rays of radiation which originate from the same point on the measurement patterning device MA' but at different scattering angles, are not coherent (due to the properties of the illumination system IL). However, for a given ray of radiation within any one of the first diffraction beams 34, 35, 36 there is a corresponding ray of radiation in each of the other first diffraction beams 34, 35, 36 that is spatially coherent with that given ray. For example, the chief rays of each of the first diffraction beams 34, 35, 36 (which correspond to the chief ray of the incident radiation 33) are coherent and could, if combined, interfere at the amplitude level.

This coherence is exploited by the measurement system 30 to determine an aberration map of the projection system PS.

The projection system PS projects part of the first diffraction beams 34, 35, 36 (which is captured by the numerical aperture of the projection system) onto the sensor apparatus 21.

In FIG. 4, the sensor apparatus 21 comprises the single second patterning region 32. As described further below (with reference to FIGS. 5A-5C), second patterned region 32 is arranged to receive these first diffraction beams 34-36 from the projection system PS and to form a plurality of second diffraction beams from each of the first diffraction beams. In order to achieve this, the second patterning region 32 comprises a two-dimensional transmissive diffraction grating. In FIG. 4, all radiation that is transmitted by the second patterning region 32 is represented as a single arrow 38. This radiation 38 is received by a detector region 39 of the radiation detector 23 and is used to determine the aberration map.

Each of the first diffraction beams 34-36 that is incident on the patterning region 32 will diffract to from a plurality of second diffraction beams. Since the second patterning region 32 comprises a two-dimensional diffraction grating, from each incident first diffraction beam, a two dimensional array of secondary diffraction beams is produced (the chief rays of these secondary diffraction beams being separated in both the shearing direction (v-direction) and the direction perpendicular thereto (the u-direction). In the following, a diffraction order that is $n^{th}$ order in the shearing direction (the v-direction) and $m^{th}$ order in the non-shearing direction (the u-direction) will be referred to as the $(n, m)^{th}$ diffraction order of the second patterned region 32. In the following, where it is not important what order a second diffraction beam is in the non-shearing direction (the u-direction), the $(n, m)^{th}$ diffraction order of the second patterned region 32 may be referred to simply as the $n^{th}$ order second diffraction beam.

Figure 5A:
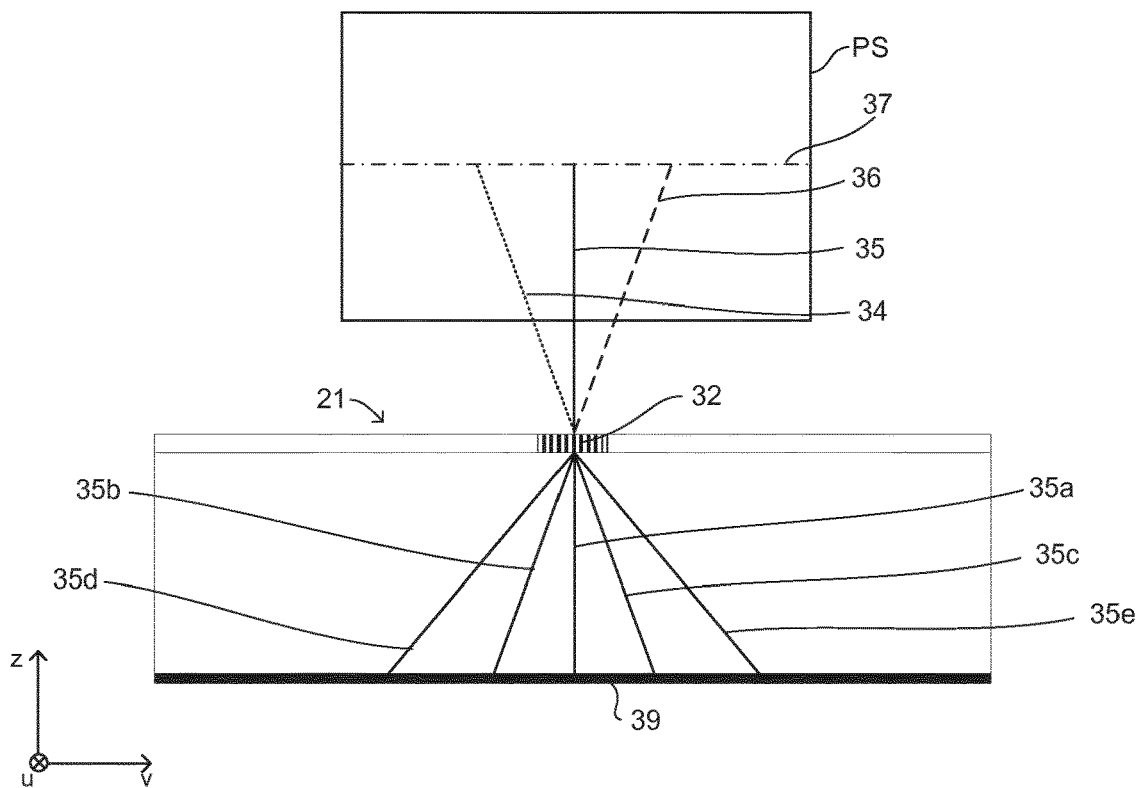
FIGS. 5A to 5C each shows a different set of second diffraction beams formed by the second patterned region of the measurement system shown in FIG. 4, that set of second diffraction beams having been produced by a different first diffraction beam formed by the first patterned region.
Figure 5B:
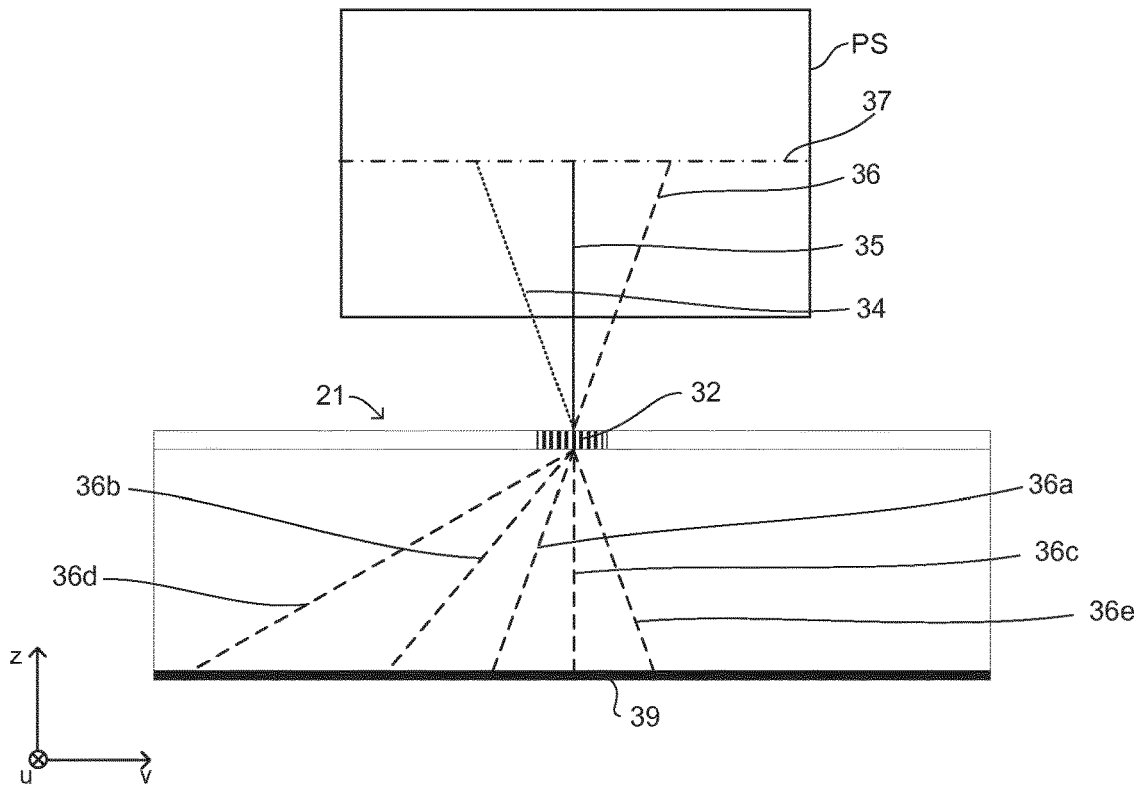
Figure 5C:
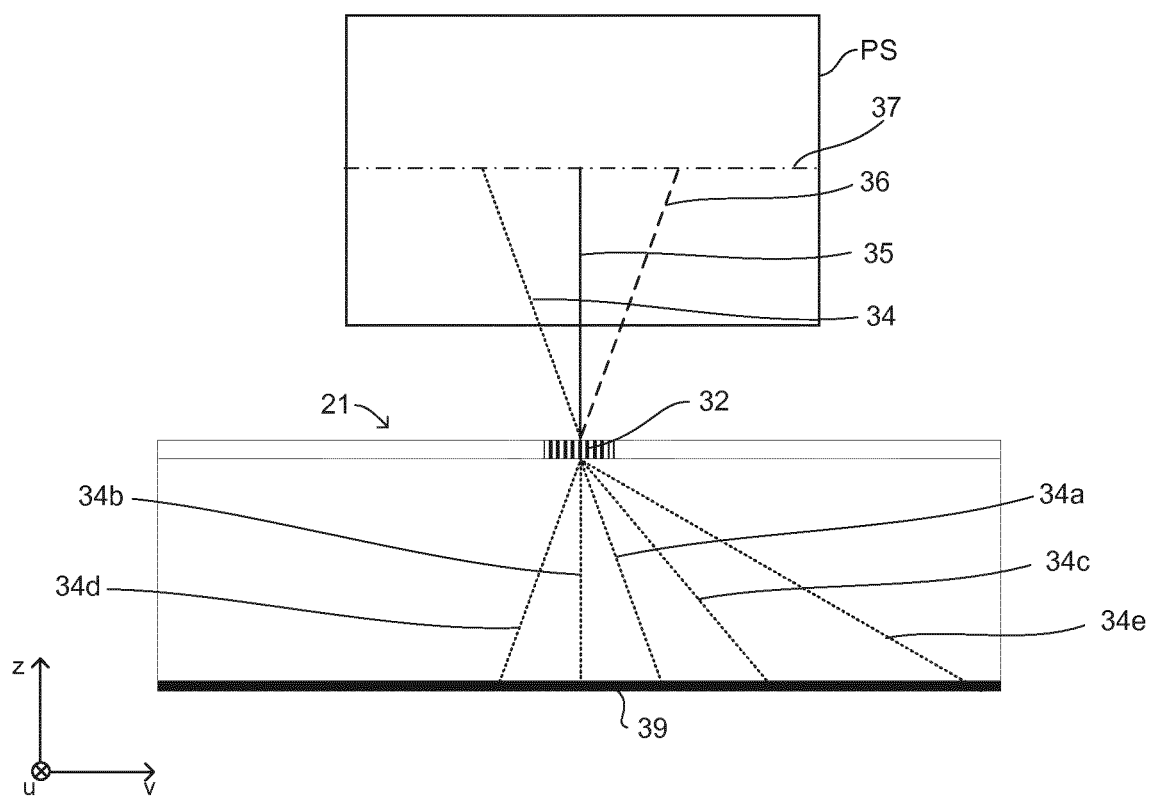

FIGS. 5A to 5C show a set of second diffraction beams produced by each of the first diffraction beams 34-36. FIG. 5A shows a set of second diffraction beams 35a-35e produced by the first diffraction beam 35 that corresponds to the $0^{th}$ order diffraction beam of first patterned region 31. FIG. 5B shows a set of second diffraction beams 36a-36e produced by the first diffraction beam 36 that corresponds to the $-1^{st}$ order diffraction beam of first patterned region 31. FIG. 5C shows a set of second diffraction beams 34a-34e produced by the first diffraction beam 34 that corresponds to the +1st order diffraction beam of first patterned region 31.

In FIG. 5A, second diffraction beam 35a corresponds to the $0^{th}$ order diffraction beam (of second patterned region 32, and in the shearing direction), whereas second diffraction beams 35b, 35c correspond to the $\pm 1^{st}$ order diffraction beams and second diffraction beams 35d, 35e correspond to the $\pm 2^{nd}$ order diffraction beams. It will be appreciated that FIGS. 5A-5C are shown in the v-z plane and the shown second diffraction beams may, for example, correspond to $0^{th}$ order diffraction beam of second patterned region 32 in the non-shearing direction (i.e. the u-direction). It will be further appreciated that there will be a plurality of copies of these second diffraction beams, representing higher order diffraction beams in the non-shearing direction that are into or out of the page of FIGS. 5A-5C.

In FIG. 5B, second diffraction beam 36a corresponds to the $0^{th}$ order diffraction beam (of second patterned region 32, and in the shearing direction), whereas second diffraction beams 36b, 36c correspond to the $\pm 1^{st}$ order diffraction beams and second diffraction beams 36d, 36e correspond to the $\pm 2^{nd}$ order diffraction beams.

In FIG. 5C, second diffraction beam 34a corresponds to the $0^{th}$ order diffraction beam (of second patterned region 32, and in the shearing direction), whereas second diffraction beams 34b, 34c correspond to the $\pm 1^{st}$ order diffraction beams and second diffraction beams 34d, 34e correspond to the $\pm 2^{nd}$ order diffraction beams.

It can be seen from FIGS. 5A-5C that several of the second diffraction beams spatially overlap with each other. For example, the second diffraction beam 35b that corresponds to the $-1^{st}$ order diffraction beam of second patterned region 32, which originates from the $0^{th}$ order diffraction beam 35 of first patterned region 31 overlaps with the second diffraction beam 36a that corresponds to the $0^{th}$ order diffraction beam of second patterned region 32, which originates from the $-1^{st}$ order diffraction beam 36 of first patterned region 31. All of the lines in FIGS. 4 and 5A-5C may be considered to represent a single ray of radiation that originates from a single input ray 33 from the illumination system IL. Therefore, as explained above, these lines represent spatially coherent rays that, if spatially overlapping at radiation detector 23 will produce an interference pattern. Furthermore, the interference is between rays which have passed though different parts of the pupil plane 37 of the projection system PS (which are separated in the shearing direction). Therefore, the interference of radiation that originates from a single input ray 33 is dependent on phase differences between two different parts of the pupil plane.

This spatial overlapping and spatial coherence of the second diffraction beams at radiation detector 23 is achieved by matching the first and second patterned regions 31, 32 such that the angular separation (in the shearing direction) between different second diffraction beams that originate from a given first diffraction beam is the same as the angular separation (in the shearing direction) between different first diffraction beams as they converge on the second patterned region 32. This spatial overlapping and spatial coherence of the second diffraction beams at radiation detector 23 is achieved by matching the pitches of the first and second patterned regions 31, 32 in the shearing direction. It will be appreciated that this matching of the pitches of the first and second patterned regions 31, 32 in the shearing direction takes into account any reduction factor applied by the projection system PS. As used herein, the pitch of a two dimensional diffraction grating in a particular direction is defined as follows.

It will be appreciated that a one-dimensional diffraction grating comprises a series of lines that are formed from a repeating pattern (of reflectivity or transmissivity) in a direction perpendicular to these lines. In the direction perpendicular to the lines, the smallest non-repeating section from which the repeating pattern is formed is referred to as the unit cell and the length of this unit cell is referred to as the pitch of the one-dimensional diffraction grating. In general, such a one-dimensional diffraction grating will have a diffraction pattern such that an incident radiation beam will be diffracted so as to form a one-dimensional array of angularly spaced (but potentially spatially overlapping) diffraction beams. The first patterned region 31 forms such a one-dimensional array of angularly spaced first diffraction beams 34-36, which are offset (angularly spaced) in the shearing direction.

It will be appreciated that a two-dimensional diffraction grating comprises a two-dimensional repeating pattern of reflectivity or transmissivity. The smallest non-repeating section from which this repeating pattern is formed may be referred to as the unit cell. The unit cell may be square and a fundamental pitch of such a two-dimensional diffraction grating may be defined as a length of the square unit cell. In general, such a two dimensional diffraction grating will have a diffraction pattern such that an incident radiation beam will be diffracted so as to form a two dimensional array of, angularly spaced (but potentially spatially overlapping) diffraction beams. The axes of this two-dimensional (square) array of diffraction beams are parallel to the sides of the unit cell. The angular separation between adjacent diffraction beams in these two directions may be given by the ratio of the wavelength of the radiation to the pitch of the grating. Therefore, the smaller the pitch, the larger the angular separation between the adjacent diffraction beams.

In some embodiments, the axes of the unit cell of the two-dimensional second patterned region 32 may be arranged at a non-zero angle to the shearing and non-shearing directions as defined by the first patterned region 31. For example, the axes of the unit cell of the two-dimensional second patterned region 32 may be arranged at 45° to the shearing and non-shearing directions as defined by the first patterned region 31. As previously explained, spatial overlapping and spatial coherence of the second diffraction beams at radiation detector 23 which allows the wavefront to be measured is achieved by ensuring that that the angular separation (in the shearing direction) between different second diffraction beams that originate from a given first diffraction beam is the same as the angular separation (in the shearing direction) between different first diffraction beams as they converge on the second patterned region 32. For an arrangement wherein the axes of the unit cell of the two-dimensional second patterned region 32 are arranged at a non-zero angle (for example 45°) to the shearing and non-shearing directions, it can be useful to define a pseudo-unit cell and a pseudo-pitch as follows. The pseudo-unit cell is defined as the smallest non-repeating square from which the repeating pattern of the diffraction grating is formed, which is orientated such that its sides are parallel to the shearing and non-shearing directions (as defined by the first patterned region 31. The pseudo-pitch may be defined as a length of the square pseudo-unit cell. This may be referred to as the pitch of a two dimensional diffraction grating in the shearing direction. It is this pseudo-pitch which should be matched to (an integer multiple or fraction of) the pitch of the first patterned region 31.

The diffraction pattern of the diffraction grating may be considered to form a two dimensional array of angularly spaced (but potentially spatially overlapping) pseudo-diffraction beams, the axes of this two-dimensional (square) array of pseudo-diffraction beams being parallel to the sides of the pseudo-unit cell. Since this square is not the unit cell (defined as to the smallest square of any orientation from which the repeating pattern of the diffraction grating is formed), the pseudo-pitch will be larger than the pitch (or fundamental pitch). Therefore, there will a smaller separation between adjacent pseudo-diffraction beams in the diffraction pattern (in a direction parallel to the sides of the pseudo-unit cell) than there is between adjacent diffraction beams in the diffraction pattern (in a direction parallel to the sides of the unit cell). This can understood as follows. Some of the pseudo-diffraction beams correspond to diffraction beams in the diffraction pattern and the other pseudo-diffraction beams are unphysical and do not represent a diffraction beam generated by the diffraction grating (and only arise due to the use of a pseudo-unit cell that is larger than the true unit cell).

Taking any reduction (or enlargement) factor applied by the projection system PS into account, either the pitch of the second patterned region 32 in the shearing direction should be an integer multiple of the pitch of the first patterned region 31 in the shearing direction or the pitch of the first patterned region 31 in the shearing direction should be an integer multiple of the pitch of the second patterned region 32 in the shearing direction. In the example shown in FIGS. 5A-5C, the pitches of the first and second patterned regions 31, 32 in the shearing direction are substantially equal (taking into account any reduction factor).

As can be seen from FIGS. 5A-5C, each point on the detector region 39 of the radiation detector 23 will, in general, receive several contributions that are summed coherently. For example, the point on the detector region 39 which receives the second diffraction beam $35b$ that corresponds to the $-1^{st}$ order diffraction beam of second patterned region 32, which originates from the $0^{th}$ order diffraction beam 35 of first patterned region 31 overlaps with both: (a) the second diffraction beam $36a$ that corresponds to the $0^{th}$ order diffraction beam of second patterned region 32, which originates from the $-1^{st}$ order diffraction beam 36 of first patterned region 31; and (b) the second diffraction beam $34d$ that corresponds to the $-2^{nd}$ order diffraction beam of second patterned region 32, which originates from the $+1^{st}$ order diffraction beam 34 of first patterned region 31. It will be appreciated that when higher order diffraction beams of the first patterned region 31 are taken into account there will be more beams that should be summed coherently at each point on the detector region 39 in order to determine the intensity of radiation as measured by that part of the detector region 39 (for example a corresponding pixel in a two dimensional array of sensing elements).

In general, a plurality of different second diffraction beams contributes to the radiation received by each part of the detector region 39. The intensity of radiation from such a coherent sum is given by:

$$I = DC + \Sigma_{pairs[i]} \gamma_i \cos(\Delta\phi_i), \quad (2)$$

where DC is a constant term (which is equivalent to the incoherent sum of the different diffraction beams), the sum is over all pairs of different second diffraction beams, $\gamma_i$ is an interference strength for that pair of second diffraction beams and $\Delta\phi_i$ is a phase difference between that pair of second diffraction beams.

The phase difference $\Delta\phi_i$ between a pair of second diffraction beams is dependent on two contributions: (a) a first contribution relates to the different part of the pupil plane 37 of the projection system PS from which they originate; and (b) a second contribution relates to the position within the unit cells of each of the first and second patterned regions 31, 32 from which they originate.

The first of these contributions can be understood to arise from the fact that the different coherent radiation beams have passed through different parts of the projection system PS and are therefore related to the aberrations that it is desired to determine (in fact they are related to a difference between two points in the aberration map that are separated in the shearing direction).

The second of these contributions can be understood to arise from the fact that the relative phases of multiple rays of radiation that arise from a single ray incident on a diffraction grating will depend on which part of the unit cell of that grating the ray was incident. This therefore does not contain information relating to the aberrations. As explained above, in some embodiments, the measurement patterning device MA' and/or the sensor apparatus 21 are sequentially scanned and/or stepped in the shearing direction. This causes the phase differences between all of pairs of interfering radiation beams received by the radiation detector 23 to change. As the measurement patterning device MA' and/or the sensor apparatus 21 are sequentially stepped in the shearing direction by an amount that is equivalent to a fraction of the pitches (in the shearing direction) of the first and second patterned regions 31, 32, in general, the phase differences between pairs of second diffraction beams will all change. If the measurement patterning device MA' and/or the sensor apparatus 21 are stepped in the shearing direction by an amount that is equivalent to an integer multiple of the pitches (in the shearing direction) of the first and second patterned regions 31, 32 the phase differences between pairs of second diffraction beams will remain the same. Therefore, as the measurement patterning device MA' and/or the sensor apparatus 21 are by sequentially scanned and/or stepped in the shearing direction, the intensity received by each part of the radiation detector 23 will oscillate. The first harmonic of this oscillating signal (which may be referred to as a phase-stepping signal), as measured by the radiation detector 23, is dependent on the contributions to equation (1) that arise from adjacent first diffraction beams 34-36, i.e. first diffraction beams that differ in order by ±1. Contributions that arise from first diffraction beams that differ in order by a different amount will contribute to higher order harmonics of the signal determined by the radiation detector 23 due to such phase stepping techniques.

For example, of the three overlapping second diffraction beams discussed above (35b, 36a and 34d) only two of the three possible pairs of these diffraction beams will contribute to the first harmonic of the phase stepping signal: (a) second diffraction beams 35b and 36a (which originate from the $0^{th}$ order diffraction beam 35 and the $-1^{st}$ order diffraction beam 36 of first patterned region 31 respectively); and (b) second diffraction beams 35a and 34d (which originate from the $0^{th}$ order diffraction beam 35 and the $+1^{st}$ order diffraction beam 34 of first patterned region 31 respectively).

Each pair of second diffraction beams will result in an interference term of the form shown in equation (2), which contributes to the first harmonic of the phase stepping signal, i.e. an interference term of the form:

$$\gamma \cos\left(\frac{2\pi}{p} \cdot v + \Delta W\right) \quad (3)$$

where γ is an amplitude of the interference term, p is the pitch of the first and second patterned regions 31, 32 (in the shearing direction), v parameterizes the relative positions of the first and second patterned regions 31, 32 in the shearing direction and ΔW is a difference between the value of the aberration map at two positions in the pupil plane of the projection system PS, the two positions corresponding to the positions from which the two second diffraction beams originate. The amplitude γ of the interference term is proportional to the product of the compound scattering efficiencies of the two second diffraction beams, as discussed further below. The frequency of the first harmonic of the phase stepping signal is given by the inverse of the pitch p of the first and second patterned regions 31, 32 in the shearing direction. The phase of the phase stepping signal is given by ΔW (the difference between the values of the aberration map at two positions in the pupil plane of the projection system PS, the two positions corresponding to the positions from which the two second diffraction beams originate).

The interference strength $\gamma_i$ for a pair of second diffraction beams is proportional to the product of the compound scattering efficiencies of the two second diffraction beams, as now discussed.

In general, the scattering efficiency of the diffraction beams produced by a diffraction grating will depend on the geometry of the grating. These diffraction efficiencies, which may be normalised to the efficiency of a $0^{th}$ order diffraction beam, describe the relative intensities of the diffraction beams. As used herein, the compound scattering efficiency of a second diffraction beam is given by the product of the scattering efficiency of the first diffraction beam from which it originates and the scattering efficiency for the diffraction order of the second patterned region 32 to which it corresponds.

In the above description of the embodiments shown in FIGS. 3A to 5C, where the first portion 15a' of the patterned region 15a shown in FIG. 3A is illuminated, the shearing direction corresponds to the v-direction and the non-shearing direction corresponds to the u-direction. It will be appreciated that when the second portion 15a" of the patterned region 15a shown in FIG. 3A is illuminated, the shearing direction corresponds to the u-direction and the non-shearing direction corresponds to the v-direction. Although in these above-described embodiments, the u and v-directions (which define the two shearing directions) are both aligned at approximately 45° relative to both the x and y-directions of the lithographic apparatus LA, it will be appreciated that in alternative embodiments the two shearing directions may be arranged at any angle to the x and y-directions of the lithographic apparatus LA (which may correspond to non-scanning and scanning directions of the lithographic apparatus LA). In general, the two shearing directions will be perpendicular to each other. In the following, the two shearing directions will be referred to as the x-direction and the y-direction. However, it will be appreciated that these shearing directions may be arranged at any angle relative to both the x and y-directions of the lithographic apparatus LA.

FIG. 6A shows the scattering efficiency for a first patterned region 31 that is of the form of the first portion 15a' of the patterned region 15a shown in FIG. 3A, having a 50% duty cycle. The horizontal axis represents the diffraction order in the shearing direction. The diffraction efficiencies shown in FIG. 6A are normalised to the efficiency of a $0^{th}$ order diffraction beam, such that the efficiency of the $0^{th}$ order diffraction beam is 100%. With this geometry (a 50% duty cycle), the efficiencies of the even diffraction orders (except the $0^{th}$ diffraction order) are zero. The efficiencies of the ±1' order diffraction beams are 63.7%.

FIG. 6B shows the scattering efficiency for a second patterned region 32 that is of the form of the diffraction grating 19a shown in FIG. 3B, i.e. in the form of a checkerboard with a 50% duty cycle. The horizontal axis represents the diffraction order in the shearing direction. The vertical axis represents the diffraction order in the non-shearing direction. The diffraction efficiencies shown in FIG. 6B are normalised to the efficiency of the $(0, 0)^{th}$ order diffraction beam, such that the efficiency of the $(0, 0)^{th}$ order diffraction beam is 100%.

As explained above, the first harmonic of the oscillating phase-stepping signal only depends on the contributions to equation (1) from first diffraction beams that differ in order by ±1. As can be seen from FIG. 6A, with a 50% duty cycle grating on the measurement patterning device MA', the only two pairs of first diffraction beams that differ in order by ±1 are the $0^{th}$ order beam with either the ±$1^{st}$ order beams. Furthermore, with this geometry for the first patterned region 31, the scattering efficiencies are symmetric such that the efficiencies of the ±$1^{st}$ order diffraction beams are both the same (63.7%). Therefore, the interference strengths $\gamma_i$ for all pairs of second diffraction beams that contribute to the first harmonic of the oscillating phase-stepping signal can be determined as follows. A second copy of the scattering efficiency plot for the second patterned region 32 shown in FIG. 6B is weighted by the scattering efficiency for the ±$1^{st}$ order diffraction beams of the first patterned region 31 and then overlaid with the scattering efficiency plot for the second patterned region 32 shown in FIG. 6B but shifted in the shearing direction by the separation of 1 pair of diffraction orders (of the first patterned region 31). Here, the pitches of the first and second patterned regions 31, 32 in the shearing direction are equal (taking into account any reduction factor applied by the projection system PS) and therefore, in this example, the second copy of the scattering efficiency plot for the second patterned region 32 is a shifted in the shearing direction by 1 diffraction order of the second patterned region 31. The product of the scattering efficiencies of these two overlaid scattering efficiencies plots is then determined. Such a plot of the interference strengths $\gamma_i$ for all pairs of second diffraction beams that contribute to the first harmonic of the oscillating phase-stepping signal is shown in FIG. 6C.

Note that each of the interference strengths $\gamma_i$ shown in FIG. 6C actually represents two different pairs of second diffraction beams. For example, the left hand pixel shown in FIG. 6C represents both: (a) interference between second diffraction beams 35a and 34b and (b) second diffraction beam 35b and 36a. Similarly, the right hand pixel shown in FIG. 6C represents both: (a) interference between second diffraction beam 35a and 36c and (b) second diffraction beam 35c and 34a. In general, each pixel of such a map represents two pairs of second diffraction beams: (a) a first pair of second diffraction beams that include one second diffraction beam that originated from the first diffraction beam 35 corresponding to the $0^{th}$ diffraction order of first patterning device 31 and another second diffraction beam that originated from the first diffraction beam 34 corresponding to the +$1^{st}$ order diffraction order of first patterned region 31; and (b) a second pair of second diffraction beams that include one second diffraction beam that originated from the first diffraction beam 35 corresponding to the $0^{th}$ diffraction order of first patterning device 31 and another second diffraction beam that originated from the first diffraction beam 36 corresponding to the –$1^{st}$ order diffraction order of first patterned region 31.

In general, each of the interference strengths $\gamma_i$ shown in FIG. 6C represents two different pairs of second diffraction beams: (a) one pair comprising an $n^{th}$ order second diffraction beam produced by the first diffraction beam 35 (that corresponds to the $0^{th}$ order diffraction beam of first patterned region 31); and (b) another pair comprising an $(n+1)^{th}$ order second diffraction beam produced by the first diffraction beam 35. Therefore, each interference strength $\gamma_i$ may be characterized by the two diffraction orders of the first diffraction beam 35 ($(n, m)^{th}$ and $(n+1, m)^{th}$) that contribute, and may be denoted as $\gamma_{n,n+1;m}$. In the following, where it is clear that m=0, or the value of m is unimportant, this interference strength may be denoted as $\gamma_{n,n+1}$.

Although each of the interference strengths $\gamma_i$ (or $\gamma_{n,n+1;m}$) shown in FIG. 6C represents two different pairs of second diffraction beams, each of the interference strengths $\gamma_i$ shown in FIG. 6C represents the second diffraction beams which contribute to the first harmonic of the oscillating phase-stepping signal and which have a different overlap, at the radiation detector 23, with a circle that represents the numerical aperture of the projection system PS, as now described.

Figure 7A:
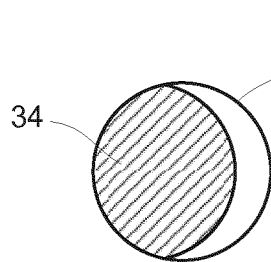
FIGS. 7A, 7B and 7C show the portion of the numerical aperture of the projection system of the measurement system shown in FIG. 4 that is filled by the three different first diffraction beams shown in FIG. 4.
Figure 7B:
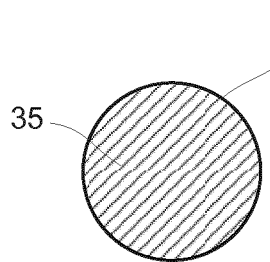
Figure 7C:
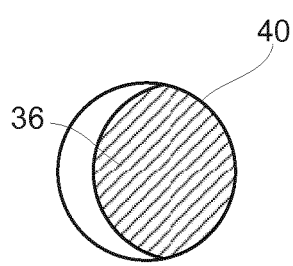

FIGS. 7A, 7B and 7C show the portion of the pupil plane 37 of the projection system PS which corresponds to the numerical aperture of the projection system PS that is filled by first diffraction beams 34, 35, 36 respectively. In each of FIGS. 7A, 7B and 7C the numerical aperture of the projection system PS is represented by a circle 40 and the portion of the pupil plane 37 of the projection system PS that is filled by first diffraction beams 34, 35, 36 is shown by a shaded region of this circle 40 in FIGS. 7A, 7B and 7C respectively. As can be seen from FIG. 7B, in the example shown, the central first diffraction beam 35 which corresponds to a $0^{th}$ order diffraction beam substantially fills the numerical aperture of the projection system PS. As can be seen from FIGS. 7A and 7C, each of the two first diffraction beams 34, 36 which correspond to the ±$1^{st}$ order diffraction beams of first patterned region 31 have been shifted such that they only partially fill the numerical aperture. It will be appreciated that this shift of the first order first diffraction beams 34, 36 relative to the numerical aperture is in practice very small and has been exaggerated here for ease of understanding.

Figure 8A:
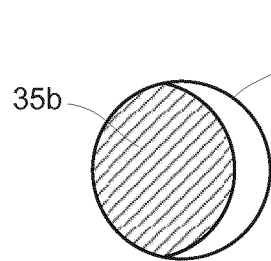
FIGS. 8A-8C show a portion of the radiation detector of the measurement system shown in FIG. 4 which corresponds to the numerical aperture of the projection system of the measurement system and which is filled by three second diffraction beams which originate from the first diffraction beam represented by FIG. 7B.
Figure 8B:
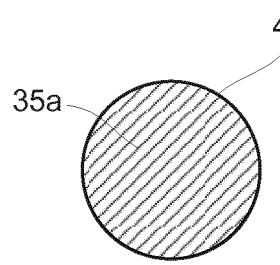
Figure 8C:
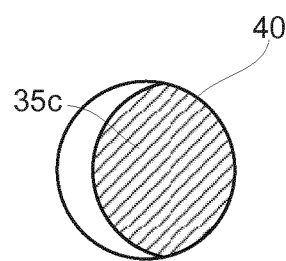
Figure 9A:
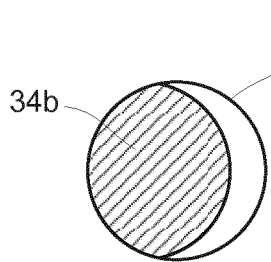
FIGS. 9A-9C show a portion of the radiation detector of the measurement system shown in FIG. 4 which corresponds to the numerical aperture of the projection system of the measurement system and which is filled by three second diffraction beams which originate from the first diffraction beam represented by FIG. 7A.
Figure 9B:
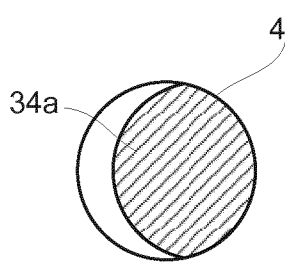
Figure 9C:
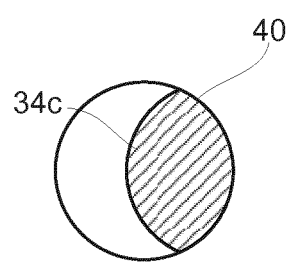
Figure 10A:
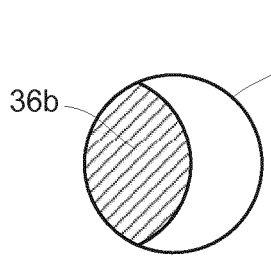
FIGS. 10A-10C show a portion of the radiation detector of the measurement system shown in FIG. 4 which corresponds to the numerical aperture of the projection system of the measurement system and which is filled by three second diffraction beams which originate from the first diffraction beam represented by FIG. 7C.
Figure 10B:
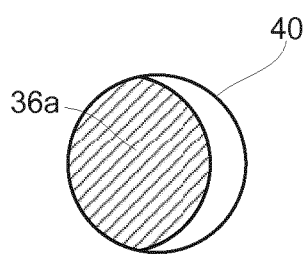
Figure 10C:
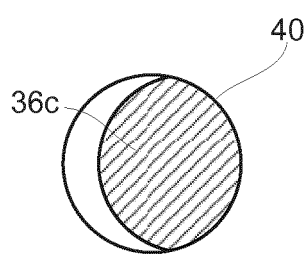

FIGS. 8A-10C show the portion of the radiation detector 23 that is filled by various second diffraction beams. In each of FIGS. 8A-10C the numerical aperture of the projection system PS is represented by a circle 40 and the portion of this circle that is filled by the second diffraction beams is shown by a shaded region of this circle 40. FIGS. 8A-8C show the portion of the circle 40 that is filled by $(-1, 0)^{th}$, $(0, 0)^{th}$ and $(1, 0)^{th}$ order diffraction beams 35b, 35a, 35c which originate from the first diffraction beam 35 which corresponds to a $0^{th}$ order diffraction beam of the first patterned region 31. FIGS. 9A-9C show the portion of the circle 40 that is filled by $(-1, 0)^{th}$, $(0, 0)^{th}$ and $(1, 0)^{th}$ order diffraction beams 34b, 34a, 34c which originate from the first diffraction beam 34 which corresponds to the $1^{st}$ order diffraction beam of the first patterned region 31. FIGS. 10A-10C show the portion of the circle 40 that is filled by $(-1, 0)^{th}$, $(0, 0)^{th}$ and $(1, 0)^{th}$ order diffraction beams 36b, 36a, 36c which originate from the first diffraction beam 36 which corresponds to the –$1^{st}$ order diffraction beam of the first patterned region 31.

It can be seen from FIGS. 8B, 9A, 8A and 10B that the region of the radiation detector which receives a contribution from both: (a) interference between second diffraction beams 35a and 34b and (b) second diffraction beam 35b and 36a is the region 41 shown in FIG. 11A. Similarly, It can be seen from FIGS. 8B, 10C, 8C and 9B that the region of the radiation detector which receives a contribution from both: (a) interference between second diffraction beam 35a and 36c and (b) second diffraction beam 35c and 34a is the region 42 shown in FIG. 11B.

In general, each of the interference strengths $\gamma_i$ shown in FIG. 6C may be considered to represent a beam of radiation formed by a plurality of interfering second interference beams, each such beam of radiation formed by a plurality of interfering second interference beams propagating in a different direction, such that the overlap of each such beam of radiation at the radiation detector 23, with a circle that represents the numerical aperture of the projection system PS is different.

In general, the second diffraction beams can be considered to form a plurality of beams of radiation, each such beam of radiation being formed by a set of interfering second diffraction beams. Each such beam of radiation may be referred to herein as an interference beam. Each such interference beam formed by a plurality of interfering second interference beams may be considered to propagate in a different direction, such that the overlap of each interference beam at the radiation detector 23 with a circle that represents the numerical aperture of the projection system PS is different. Although they may be considered to propagate in different directions and have a different overlap with a circle that represents the numerical aperture of the projection system PS, there is significant overlap between the different interference beams at the radiation detector 23. Each of the interference strengths $\gamma$, shown in FIG. 6C may be considered to represent a different interference beam (formed by a plurality of interfering second interference beams).

As previously described, each of the interference strengths $\gamma_i$ (or $\gamma_{n,n+1;m}$) shown in FIG. 6C represents two different pairs of second diffraction beams. However, for a given position on the radiation detector, both of these pairs of contributing second diffraction beams comprise two interfering rays that originate from the same two points in the pupil plane 37 of the projection system PS. In particular, for a position (x, y) on the radiation detector (these co-ordinates corresponding to co-ordinates of the pupil plane 37 of the projection system PS and the x direction corresponding to the shearing direction), the two pairs of interfering second diffraction beams that contribute and have an interference strengths $\gamma_{n,n+1;m}$ each comprise a ray of a second diffraction beam that originated from a position (x−ns, y−ms) in the pupil plane 37 and a ray of a second diffraction beam that originated from a position (x−(n+1)s, y−ms) in the pupil plane 37, where s is a shearing distance. The shearing distance s corresponds to the distance in the pupil plane 37 between two coherent rays of adjacent first diffraction beams 34-36. Therefore, both pairs of contributing second diffraction beams give rise to an interference term of the form of expression (3), where ΔW is a difference between the value of the aberration map at these two positions in the pupil plane 37.

It can be seen from FIG. 6C that with a second patterned region 32 which is of the form of a 50% duty cycle checkerboard there are only two sets of second diffraction beams that contribute to the first harmonic of the phase stepping signal, both with an interference strength ($\gamma_{-1,0}$, $\gamma_{0,+1}$) of 25.8%. This is due to the checkerboard geometry, which, as can be seen in from FIG. 6A, results in a diffraction efficiency plot where, with the exception of the $(-1, 0)^{th}$, $(0, 0)^{th}$ and $(1, 0)^{th}$ order diffraction beams, moving in the shearing direction, every other diffraction beam has a diffraction efficiency of 0%. That is, the grating efficiencies of the $(n, m)^{th}$ diffraction orders wherein n±m is an even number are all zero, except the $(0, 0)^{th}$ diffraction order. As a result of these grating efficiencies being zero, all of the interference strengths which contribute to the first harmonic of the phase stepping signal are zero except for interference strengths $\gamma_{-1,0}$ to and $\gamma_{0,+1}$.

Figures 11A, 11B:
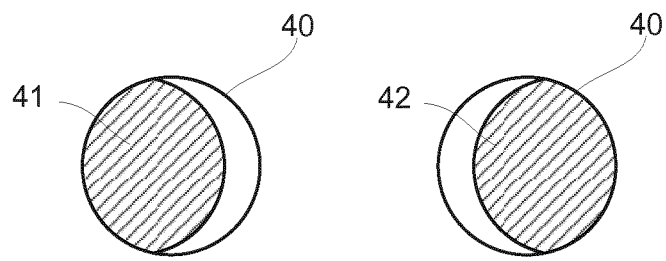
FIG. 11A show a portion of the radiation detector of the measurement system shown in FIG. 4 which corresponds to the numerical aperture of the projection system of the measurement system and which represents the overlap between the second diffraction beams shown in FIGS. 8B and 9A and the overlap between the second diffraction beams shown in FIGS. 8A and 10B.
FIG. 11B show a portion of the radiation detector of the measurement system shown in FIG. 4 which corresponds to the numerical aperture of the projection system of the measurement system and which represents the overlap between the second diffraction beams shown in FIGS. 8B and 10C and the overlap between the second diffraction beams shown in FIGS. 8C and 9B.

For the overlap between the two regions 41, 42 shown in FIGS. 11A and 11B (this overlap region will form the majority of circle 40 for small shearing angles) the first harmonic of the oscillating phase-stepping signal will be proportional to the sum of two cosines (cf. equation (2) and expression (3)):

$$I=DC+\gamma_{-1,0}\cos(W_{-1}-W_0)+\gamma_{0,+1}\cos(W_0-W_{+1}) \qquad (4)$$

where the first cosine is of a difference in the aberration map between a first two points in the pupil plane and the second cosine is of a difference in the aberration map between a second two points in the pupil plane (here the phase stepping terms have been omitted for clarity of understanding). In particular, for a given position (x, y) on the radiation detector (x referring to the shearing direction), the first two points include a corresponding point in the pupil plane (x, y) (represented as $W_0$ in equation (4)) and another point which is shifted in a first direction along the shearing direction by the shearing distance (x−s, y) (represented as $W_{-1}$ in equation (4)). Similarly, the second two points include a corresponding point in the pupil plane (x, y) (represented as $W_0$ in equation (4)) and another point which is shifted in a second direction along the shearing direction by the shearing distance (x+s, y) (represented as $W_{+1}$ in equation (4)).

Existing wavefront reconstruction techniques exploit the fact that the two interference strengths in equation (4) are equal such that this sum of two cosines can be re-written using trigonometric identities as a cosine of the difference in the aberration map between two positions that are separated in the shearing direction by twice the shearing distance, i.e. $\cos(W_{-1}-W_{+1})$, multiplied by a factor that is approximately 1 for small shearing distances. Therefore, such known techniques involve the determination of a set of Zernike coefficients by equating the phase of the first harmonic of a phase stepping signal to a difference in the aberration map between positions in the pupil plane that are separated in the shearing direction by twice the shearing distance. Recall that the aberration map depends on the Zernike coefficients (see equation (1)). This is done for a plurality of positions on the radiation sensor (for example at a plurality of pixels or individual sensing elements in an array) first for a first shearing direction and then subsequently for a second, orthogonal direction. These constraints for the two shearing orthogonal directions are simultaneously solved to find the set of Zernike coefficients.

As discussed above, the combination of a first patterned region 31 comprising a linear grating and a second patterned region 32 comprising a two-dimensional checkerboard is advantageous (since only two interference beams contribute to the first harmonic of the phase stepping signal). Due to the geometry of the checkerboard, checkerboard gratings typically comprise an optical transmissive carrier or support layer. However, EUV radiation is strongly absorbed by most materials and therefore no good transmissive materials exist for EUV radiation. Furthermore, such a transmissive carrier is not favourable in a wafer production environment of an EUV lithographic system, since the transmissive carrier will rapidly become contaminated in such an environment. This would render the transmissive carrier untransmissive for EUV. Such contamination problems which could only be addressed by regular cleaning actions that would impact system availability and therefore the throughput of the lithographic system. For the above-mentioned reasons a checkerboard grating arrangement is difficult to implement for lithographic systems that use EUV radiation.

Figure 12:
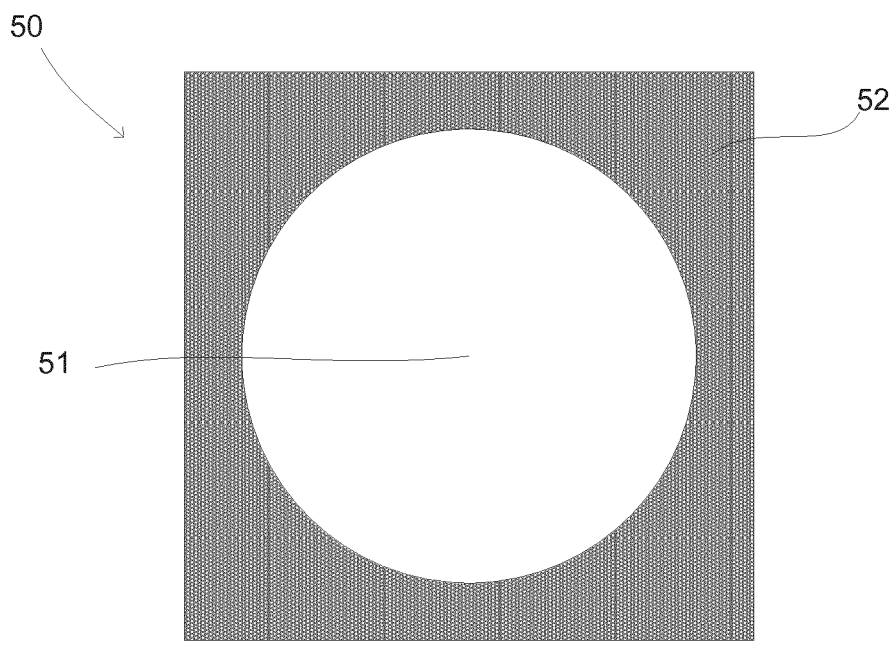
FIG. 12 shows a unit cell of a grating comprising an array of circular pinholes and having a 50% (by area) duty cycle.

For this reason, existing aberration measurement systems for EUV radiation use, as a second patterned device 32, a geometry which uses an array of circular pinholes. FIG. 12 shows the unit cell 50 of such a grating, having a 50% (by area) duty cycle. The unit cell 50 comprises a circular aperture 51 provided in an EUV absorbing membrane 52. The circular aperture 51 is a through aperture which represents a void in the EUV absorbing membrane 52 through which EUV radiation is transmitted. However, such a pinhole array geometry (as shown in FIG. 12) generates unwanted interference beams that contribute to the first harmonic of the phase stepping signal, as now discussed with reference to FIGS. 13A-13B.

Figures 13A, 13B, 13C:
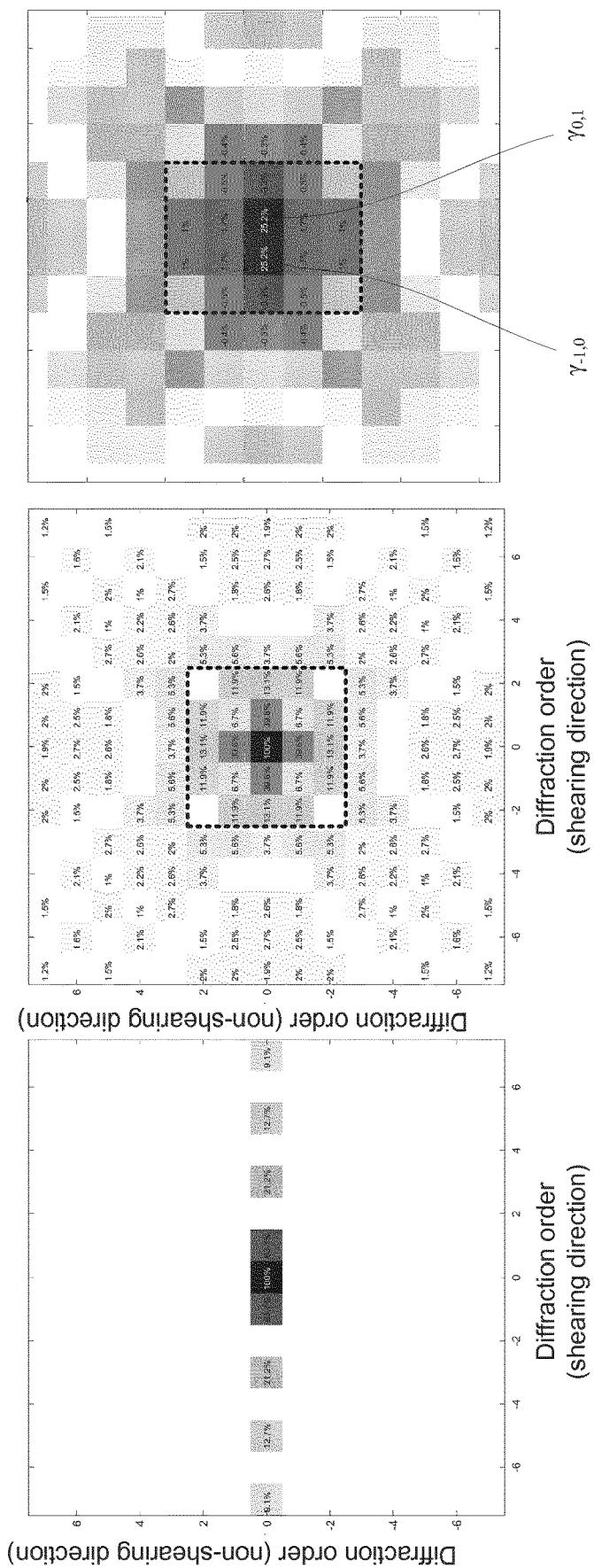
FIG. 13A shows the scattering efficiency for one dimensional diffraction grating with a 50% duty cycle and which may represent the first patterned region of the measurement system shown in FIG. 4.
FIG. 13B shows the scattering efficiency for two dimensional diffraction comprising the unit cell of FIG. 12 and which may represent the second patterned region of the measurement system shown in FIG. 4.
FIG. 13C shows an interference strength map for the measurement system shown in FIG. 4 when employing the first patterned region shown in FIG. 13A and the second patterned region shown in FIG. 13B, each of the interference strengths shown representing the second interference beams which contribute to the first harmonic of the oscillating phase-stepping signal and which have a different overlap, at the radiation detector, with a circle that represents the numerical aperture of the projection system.

FIG. 13A shows the scattering efficiency for a first patterned region 31 that is of the form of the first portion 15a' of the patterned region 15a shown in FIG. 3A, having a 50% duty cycle (of the same geometry as that shown in FIG. 6A). Again, the diffraction efficiencies are normalised to the efficiency of a $0^{th}$ order diffraction beam, such that the efficiency of the $0^{th}$ order diffraction beam is 100%. FIG. 13B shows the scattering efficiency for a second patterned region 32 that is of the form of a pinhole array having the unit cell 50 shown in FIG. 12. The diffraction efficiencies shown in FIG. 13B are normalised to the efficiency of the $(0, 0)^{th}$ order diffraction beam, such that the efficiency of the $(0, 0)^{th}$ order diffraction beam is 100%.

FIG. 13C is a plot of the interference strengths $\gamma_{n,n+1}$ for interference beams that contribute to the first harmonic of the oscillating phase-stepping signal (this is constructed from the scattering efficiencies of FIGS. 13A and 13B in an analogous manner to the construction of FIG. 6C from the scattering efficiencies of FIGS. 6A and 6B).

It can be seen from FIG. 13C that with a second patterned region 32 which has the unit cell 50 shown in FIG. 12, in addition to the two main interference beams (with interference strengths $\gamma_{-1,0}$, $\gamma_{0,+1}$ of 25.2%), there are a number of additional interference beams with small, but non-zero, interference strengths $\gamma_{n,n+1}$. Since the interference strengths for these additional interference beams are not the same, for regions of the radiation detector 23 where multiple interference beams overlap, the first harmonic of the oscillating phase-stepping signal will be proportional to a weighted sum of a plurality of cosines (cf. equation (4)), the cosines having different weights. As a result, they cannot be combined easily using trigonometric identities. However, since the interference strengths $\gamma_{n,n+1}$ for the additional interference beams are small (in comparison to the interference strengths $\gamma_{-1,0}$, $\gamma_{0,+1}$), such known existing aberration measurement systems for EUV radiation neglect these terms (i.e. assume they are zero) in the reconstruction of the wavefront to find the set of Zernike coefficients.

This assumption impacts the accuracy of the wavefront measurement. In turn, this has a negative impact on system imaging, overlay and focus performance. Embodiments of the present invention have been devised to at least partially address the above-described problems for aberration measurement systems for EUV radiation.

Some embodiments of the present invention relate to two-dimensional diffraction gratings, which may form the second patterned region 32, the diffraction gratings comprising a substrate provided with a square array of through-apertures, wherein the diffraction grating is self-supporting. In particular, embodiments of the present invention relate to such self-supporting two-dimensional diffraction gratings which reduce the number of interference beams that contribute significantly to the first harmonic of the phase stepping signal (for example relative to a grating using the unit cell 50 shown in FIG. 12).

It will be appreciated that a square array of apertures comprises a plurality of rows of apertures arranged such that the centres of the apertures form a square grid.

It will be further appreciated that for a substrate provided with a square array of through-apertures to be self-supporting at least some substrate material is provided between each through-aperture and the adjacent through apertures.

The substrate may comprise a support layer and a radiation absorbing layer. The through-apertures may extend through both the support layer and the radiation absorbing layer. The through-apertures may be formed by selectively etching material from the support layer and the radiation absorbing layer. For example, this may be achieved using lithographic techniques followed by an etching process. The support layer may, for example, be formed from SiN. The radiation absorbing layer may, for example, be formed from a metal such as, for example, chromium (Cr), nickel (Ni) or cobalt (Co).

Since the two-dimensional diffraction grating is self-supporting it does not need, for example a transmissive supporting layer. Therefore these embodiments of the invention are particularly beneficial for use in a phase-stepping measurement system for determining an aberration map for a projection system that uses EUV radiation.

For example, the two-dimensional diffraction grating may have a geometry that is arranged to result in a grating efficiency map that reduces the number of contributions (for example above a threshold) to the first harmonic of the phase stepping signal assuming that the two-dimensional diffraction grating will be used with a typical first patterned region 31. Typical first patterned regions 31 include the above-described one-dimensional diffraction grating 31 with a 50% duty cycle. Other typical first patterned regions 31 include a two-dimensional checkerboard diffraction grating with a 50% duty cycle.

Figure 14:
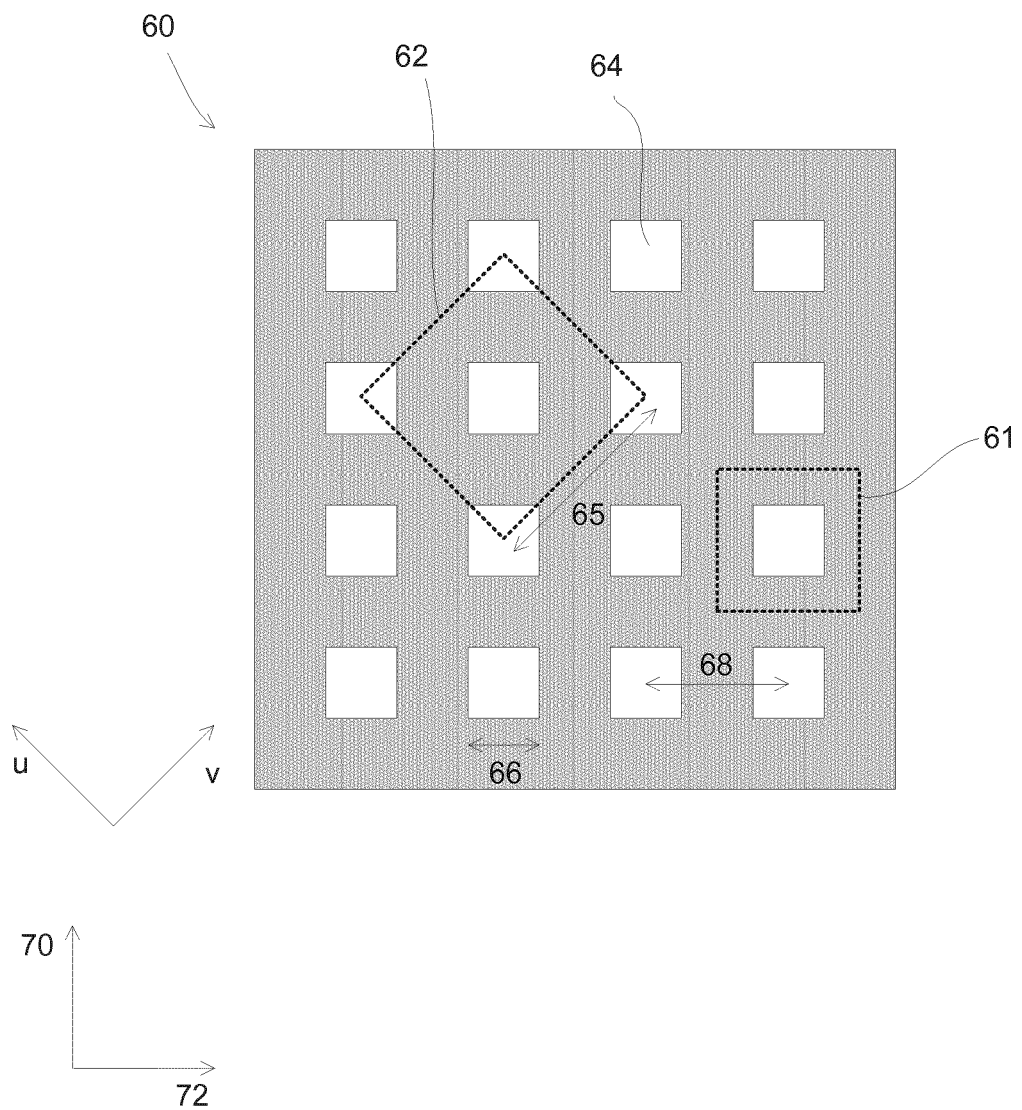
FIG. 14 shows a portion of a first embodiment of a self-supporting grating according to the present invention the grating.

A first embodiment of a self-supporting grating 60 according to the present invention is now described with reference to FIGS. 14-17C. FIG. 14 shows a portion of the grating 60, which has a geometry which may be referred to as a Gingham geometry or pattern. The unit cell 61 of self-supporting grating 60 is also indicated in FIG. 14 by a dotted line. It will be appreciated that self-supporting grating 60 may have fewer or more repetitions of the unit cell 61 than are shown in FIG. 14.

The two-dimensional diffraction grating 60 comprises a square array of square apertures 64. Each of the square apertures 64 has a length 66 that is half the distance 68 between the centres of adjacent apertures 64. Here it will be understood that adjacent apertures are intended to mean those displaced by one position in the square array in a direction parallel to one of the axes 70, 72 of the square array formed by the square apertures 64. Note that the sides of the square apertures 64 are parallel to the axes 70, 72 of the square array formed by the square apertures 64. The unit cell 61 has a length (which defines a pitch of the grating) which is equal to the distance 68 between the centres of adjacent apertures 64.

The sides of the square unit cell 61 are parallel to the axes 70, 72 of the square array formed by the square apertures 64. The diffraction beams formed by the grating 60 therefore form a square array of second diffraction beams, the axes of which are parallel to the axes 70, 72 of the square array formed by the square apertures 64. As will be explained further below, the self-supporting grating 60 may form the second patterned region 32 and axes indicating the u-direction and v-direction (which may represent the shearing and non-shearing directions defined by the first patterned region 31) for such embodiments are also indicated in FIG. 14 and are disposed at 45° to the sides of the unit cell 61.

The grating 60 may be considered to be formed from a combination of two one-dimensional gratings, each having a 50% duty cycle, the two one-dimensional gratings being orthogonal.

The Gingham grating geometry of grating 60 is suitable for use with a first patterned region 31 with the shearing and non-shearing directions (indicated by the u and v axes in FIG. 14) defined by said first patterned region 31 being disposed at 45° to the unit cell 61, the first patterned region 31 having a pitch (taking into account any reduction factor applied by the projection system PS) that is equal to the pitch 68 of the two-dimensional diffraction grating 60 divided by as now described with reference to FIGS. 15A-17C.

Figure 15A:
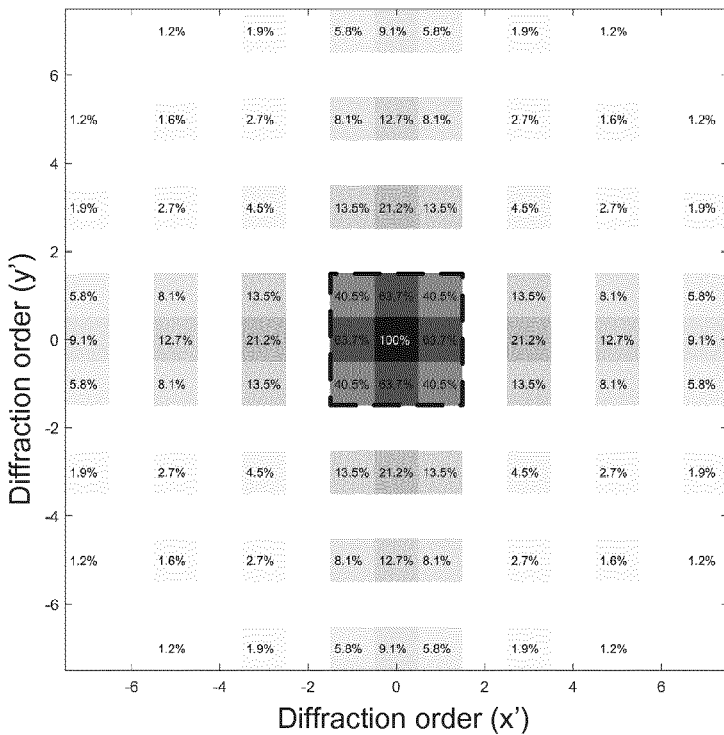
FIG. 15A shows the diffraction efficiencies of the diffraction pattern of the two-dimensional diffraction grating shown in FIG. 14, as a square array of angularly spaced diffraction beams, the axes of this square array being parallel to the sides of the unit cell of the two-dimensional diffraction grating shown in FIG. 14.

Unit cell 61 is the smallest non-repeating section from which the repeating pattern of two-dimensional diffraction grating 60 is formed. The fundamental pitch 68 of such the two-dimensional diffraction grating 60 is the length of the square unit cell 61. A plot of the diffraction efficiencies 74 of the diffraction pattern of the two-dimensional diffraction grating 60 is shown in FIG. 15A. In FIG. 15A, each square represents a different diffraction order produced by the diffraction grating 60. It will be appreciated that the two dimensional diffraction grating 60 has a diffraction pattern such that an incident radiation beam will be diffracted so as to form a two dimensional array of angularly spaced (but potentially spatially overlapping) diffraction beams. The axes of this two-dimensional (square) array of diffraction beams are parallel to the sides of the unit cell 61. The axes of this two-dimensional (square) array of diffraction beams are therefore coincident with the axes 70, 72 of the square array formed by the square apertures 64 (shown in FIG. 14) and are labelled as y' and x' respectively in FIG. 15A.

As explained above, grating 60 is suitable for use with a first patterned region 31 with the shearing and non-shearing directions (indicated by the u and v axes in FIG. 14) defined by said first patterned region 31 being disposed at 45° to the unit cell 61. For such an arrangement wherein the axes of the unit cell 61 of the two-dimensional grating 60 are arranged at 45° to the shearing and non-shearing directions, it is useful to define a pseudo-unit cell 62 and a pseudo-pitch 65 as follows. The pseudo-unit cell 62 is defined as the smallest non-repeating square from which the repeating pattern of the diffraction grating 60 is formed, which is orientated such that its sides are parallel to the shearing and non-shearing directions as defined by the first patterned region 31 (indicated by the u and v axes in FIG. 14). The pseudo-pitch 65 is defined as a length of the square pseudo-unit cell 62. This may be referred to as the pitch of a two dimensional diffraction grating 60 in the shearing direction. It is this pseudo-pitch 62 which should be matched to (an integer multiple or fraction of) the pitch of the first patterned region 31.

Figure 15B:
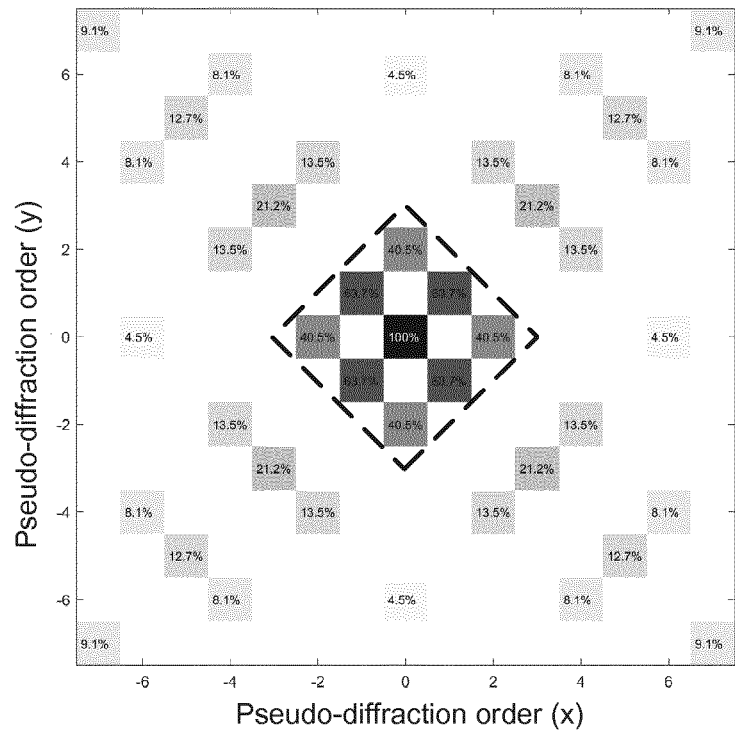
FIG. 15B shows the diffraction efficiencies of the diffraction pattern of the two-dimensional diffraction grating shown in FIG. 14, rotated by 45° with respect to FIG. 15A such that the axes of FIG. 15B are disposed at 45° with respect to the unit cell of the two-dimensional diffraction grating shown in FIG. 14.

The diffraction pattern of the diffraction grating 60 may be considered to form a two dimensional array of angularly spaced (but potentially spatially overlapping) pseudo-diffraction beams, the axes of this two-dimensional (square) array of pseudo-diffraction beams being parallel to the sides of the pseudo-unit cell 62. Another plot of the diffraction efficiencies 74 of the diffraction pattern of the two-dimensional diffraction grating 60 is shown in FIG. 15B. In FIG. 15B, each square represents a different pseudo-diffraction order produced by the diffraction grating 60. The relationship between FIGS. 15A and 15B is explained further with reference to FIGS. 16A and 16B.

Figure 16A:
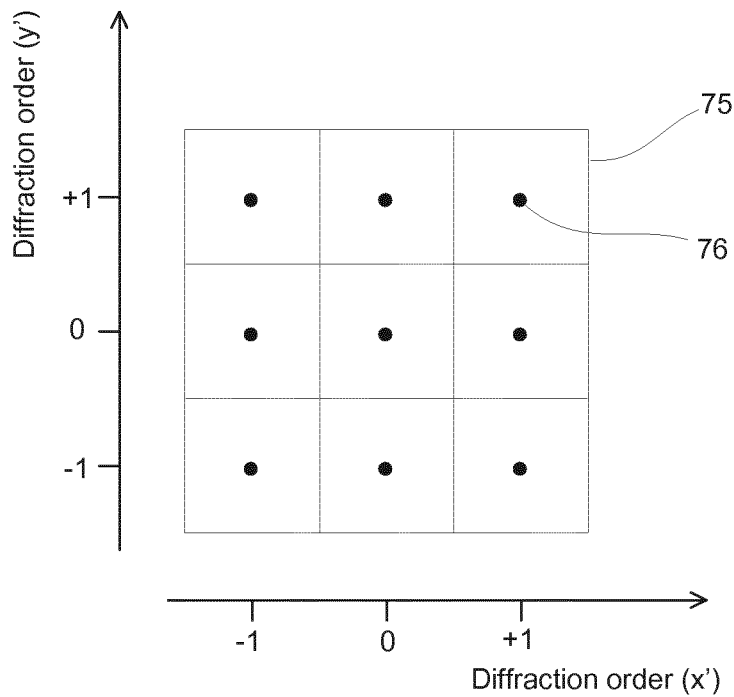
FIG. 16A is a schematic representation of diffraction orders of the two dimensional diffraction grating shown in FIG. 14, each diffraction order being represented by a circle and a square.

FIG. 16A is a schematic representation of diffraction orders of the two dimensional diffraction grating 60. In particular, FIG. 16A is a schematic representation of diffraction orders of the two dimensional diffraction grating 60 that correspond to the grating efficiencies within the dashed square shown in FIG. 15A. The pseudo-diffraction order grating efficiencies in FIG. 15B which are equivalent to the grating efficiencies contained in the dashed square shown in FIG. 15A are indicated by a dashed square shown in FIG. 15B. As in FIG. 15A, each diffraction order is represented by a square 75. However, it will be appreciated that the direction, or the chief ray, of each such diffraction order may be represented by a circle 76 at the centre of each such square (also shown in FIG. 15A).

Figure 16B:
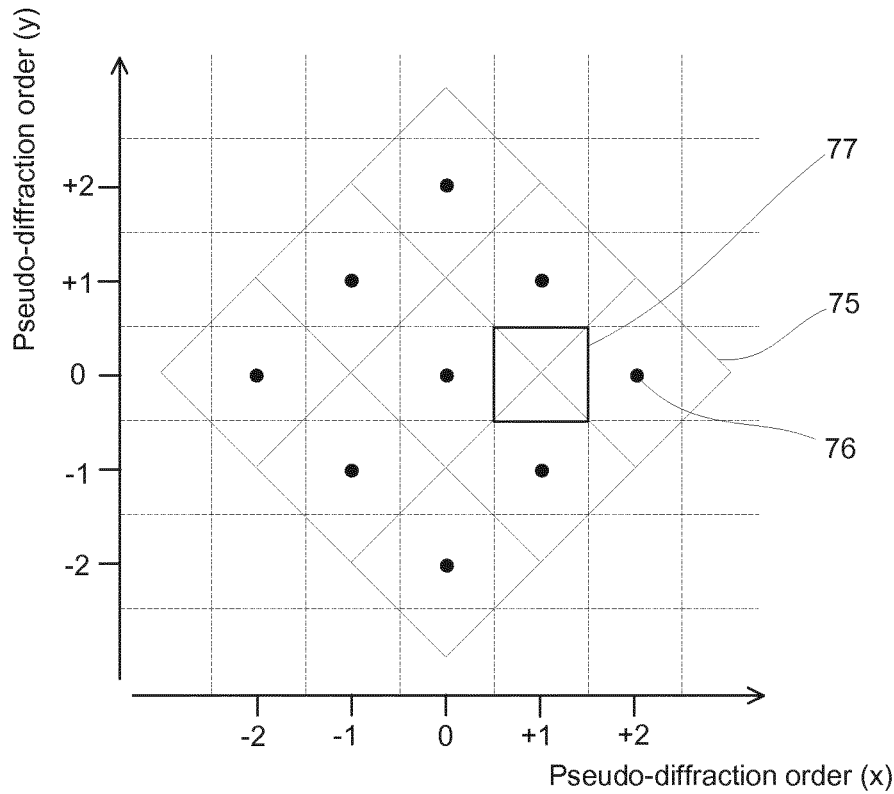
FIG. 16B shows the same representation of the diffraction pattern of the two dimensional diffraction grating shown in FIG. 14 as is shown in FIG. 16A but rotated by 45°.

The diffraction pattern of the two dimensional diffraction grating 60 is the form a two dimensional array of, angularly spaced (but potentially spatially overlapping) diffraction beams. The axes of this two-dimensional square array of diffraction beams are parallel to the sides of the unit cell 61 and are labelled as y' and x' respectively in FIG. 16A. FIG. 16B shows the same representation of the diffraction pattern of the two dimensional diffraction grating 60 but rotated by 45° (i.e. the x and y axes shown in FIG. 16B are rotated by 45° relative to axes x' and y' respectively in FIG. 16A). It will be appreciated that by a suitable definition of the scale of the x and y axes, the diffraction pattern may be considered to form a square array of pseudo-diffraction beams (as indicated by the grid of dashed lines), some of which correspond to one of the diffraction beams (indicated by the circles 76) and some of which do not correspond to any of the diffraction beams. This definition of the scale of the x and y axes corresponds to the diffraction orders that would be formed if the pseudo-unit cell 62 were the true unit cell of the grating 60.

It will be appreciated that pseudo-unit cell 62 defines a pseudo-pitch 65 that is larger than the true pitch 68 of the two dimensional diffraction grating 60 by a factor of $\sqrt{2}$. As a result, the separation between adjacent pseudo-diffraction beams (i.e. between adjacent dashed squares in FIG. 16B) in the diffraction pattern is smaller than the separation between adjacent diffraction beams (i.e. between adjacent squares 75 in FIG. 16A) by a factor of $\sqrt{2}$. It will be further appreciated that whilst some of the pseudo-diffraction beams correspond to one of the diffraction beams in the diffraction pattern (i.e. those which contain a circle 76 in FIG. 16B), some of the pseudo-diffraction beams are unphysical and do not represent a diffraction beam generated by the diffraction grating. These unphysical pseudo-diffraction orders arise due to the use of a pseudo-unit cell 62 that is larger than the true unit cell 61. One such unphysical pseudo-diffraction order (the (1,1) order) is indicated by solid square 77. It can be seen that from FIG. 16B that the $(n, m)^{th}$ pseudo-diffraction orders for which n±m is even (i.e. equal to 2p, where p is an integer) correspond to physical diffraction orders whereas the $(n, m)^{th}$ pseudo-diffraction orders for which n±m is odd (i.e. equal to 2p+1, where p is an integer) are unphysical.

FIG. 17A shows the scattering efficiency for a first patterned region 31 that is of the form of the first portion 15a' of the patterned region 15a shown in FIG. 3A, having a 50% duty cycle (of the same geometry as that shown in FIG. 6A). Again, the diffraction efficiencies are normalised to the efficiency of a $0^{th}$ order diffraction beam, such that the efficiency of the $0^{th}$ order diffraction beam is 100%. FIG. 17B shows the scattering efficiency of pseudo-diffraction orders for a second patterned region 32 that is of the form of the grating 60 having the pseudo-unit cell 62 as shown in FIG. 14. The diffraction efficiencies shown in FIG. 17B are normalised to the efficiency of the $(0, 0)^{th}$ order pseudo-diffraction beam, such that the efficiency of the $(0, 0)^{th}$ pseudo-order diffraction beam is 100%.

Note that the pitch of the first patterned region 31 corresponding to the scattering efficiency plot of FIG. 17A is (taking into account any reduction factor applied by the projection system PS) half the pseudo-pitch 65 of the two-dimensional diffraction grating 60 corresponding to the scattering efficiency plot of FIG. 17B. Equivalently, the pitch of the first patterned region 31 corresponding to the scattering efficiency plot of FIG. 17A is (taking into account any reduction factor applied by the projection system PS) equal to the true pitch 68 of the two-dimensional diffraction grating 60 divided by $\sqrt{2}$.

Note that in FIG. 17A the axes are labelled in units of the diffraction order of the first patterned region 31 whereas in FIG. 17B the axes are labelled in units of the pseudo-diffraction order of the second patterned region 32 (two-dimensional diffraction grating 60). However, the scales of FIGS. 17A and 17B are matched (note that FIG. 17A is the same grating efficiency plot as FIG. 13A but with a different axis scale) in order to reflect the fact the pitch of the first patterned region 31 is (taking into account any reduction factor applied by the projection system PS) half the pseudo-pitch 65 of the two-dimensional diffraction grating 60. That is, the scales of FIGS. 17A and 17B are such that the (angular) separation between a pair of adjacent first diffraction beams (for example the $0^{th}$ and $1^{st}$ order first diffraction beams) is equal to twice the separation between a pair of adjacent second diffraction beams (for example the $0^{th}$ and $1^{st}$ order first diffraction beams).

With such an arrangement, the interference strengths for all pairs of second diffraction beams that contribute to the first harmonic of the oscillating phase-stepping signal can be determined by overlaying a second copy of the scattering efficiency plot of FIG. 17B weighted by the scattering efficiency for the $\pm 1^{st}$ order diffraction beams of the first patterned region 31 with the scattering efficiency plot of FIG. 17B. Again, this copy is shifted in the shearing direction by 1 diffraction order of the first diffraction grating 31, which corresponds to 2 pseudo-diffraction orders of the two-dimensional diffraction grating.

FIG. 17C is a plot of the interference strengths $\gamma_{n,n+1}$ for interference beams that contribute to the first harmonic of the oscillating phase-stepping signal constructed from the scattering efficiencies of FIGS. 17A and 17B in this way.

It can be seen from FIG. 17C that with a second patterned region 32 which has the grating 60 with the pseudo-unit cell 62 shown in FIG. 14, only four interference beams (all with an equal interference strength of 25.8%) contribute. This grating 60 therefore provides an arrangement that is self-supporting (and therefore suitable for use within EUV lithographic systems) but which reduces the number of interference beams that contribute to the first harmonic of the phase stepping signal (at least relative to known EUV measurement systems that use a grating having the unit cell 50 shown in FIG. 11).

Recall that FIG. 17C can be generated by overlaying two copies of the diffraction efficiency plot of FIG. 17B (one being weighted by 63.7%) which are shifted in the shearing direction by 2 pseudo-diffraction orders of the two-dimensional diffraction grating 60. Therefore, it can be seen that the cancellation that occurs which results in only four contributions in FIG. 17C occurs since the diffraction efficiencies for the (n, m)$^{th}$ pseudo-diffraction orders for which n±m is equal to 4p, where p is a non-zero integer (i.e. −12, −8, −4, 4, 8, 12, . . . ) are zero. Therefore, in variations of the above described embodiment, the self-supporting grating may have a different geometry but one which suppresses grating efficiencies of the (n, m)$^{th}$ pseudo-diffraction orders for all orders except those for which n±m is equal to 4p, where p is a non-zero integer. Furthermore, from a consideration of FIGS. 15A and 15B, it can be seen that the (n, m)$^{th}$ pseudo-diffraction orders for which n±m is equal to 4p, where p is a non-zero integer (i.e. −12, −8, −4, 4, 8, 12, . . . ) will be zero (or at least supressed) if the (n, m)$^{th}$ diffraction orders are zero (or at least supressed) when either n or m is a non-zero even number.

Figure 18:
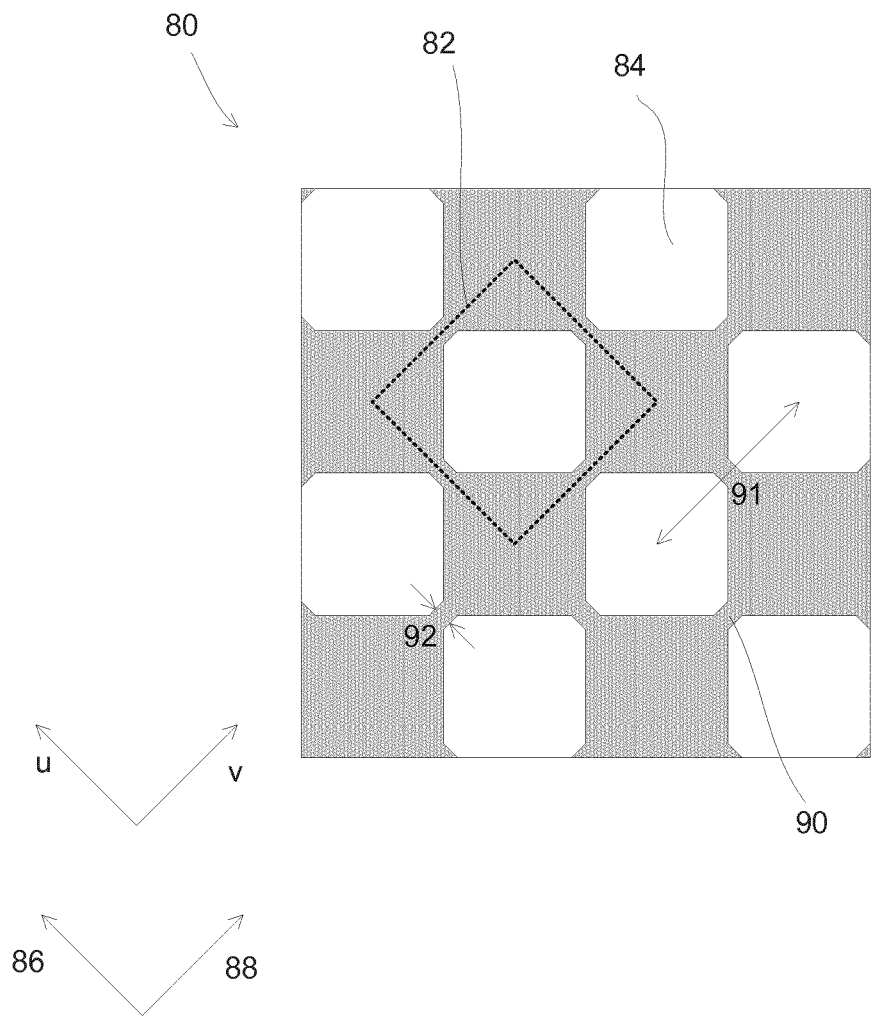
FIG. 18 shows a portion of a second embodiment of a self-supporting grating according to the present invention the grating.

A second embodiment of a self-supporting grating 80 according to the present invention is now described with reference to FIGS. 18-19B. FIG. 18 shows a portion of the grating 80. The unit cell 82 of self-supporting grating 80 is also indicated in FIG. 14 by a dotted line. It will be appreciated that self-supporting grating 80 may have fewer or more repetitions of the unit cell 82 than are shown in FIG. 18.

The two-dimensional diffraction grating 80 comprises a square array of through-apertures 84 which are generally octagonal. Generally octagonal through-apertures 84 are formed from a square that is orientated at 45° to the axes 86, 88 of the square array of through-apertures 84 and having a diagonal dimension that matches a distance 91 between the centres of adjacent through-apertures, each of the four corners of the square having been truncated so as to form a generally rectangular connecting portion 90 of the substrate between each pair of adjacent through apertures 84.

This grating 80 provides an arrangement that is similar to a checkerboard grating but wherein connecting portions 90 or side-bars are provided to ensure that the grating 80 is self-supporting.

It will be appreciated that the dimensions of such connecting portions 90 that are provided so as to ensure that the grating 80 is self-supporting may be dependent on the thickness of the substrate. In some embodiments, a width 92 of the generally rectangular connecting portions 90 is approximately 10% of the distance between the centres of adjacent through-apertures 84. For example, the width of the generally rectangular connecting portions 90 of the substrate between each pair of adjacent through apertures may be between 5% and 15% of the distance between the centres of adjacent through-apertures 84, for example, between 8% and 12% of the distance between the centres of adjacent through-apertures 84.

The self-supporting grating 80 may form the second patterned region 32 and axes indicating the u-direction and v-direction for such embodiments are also indicated in FIG. 18.

Figure 19B:
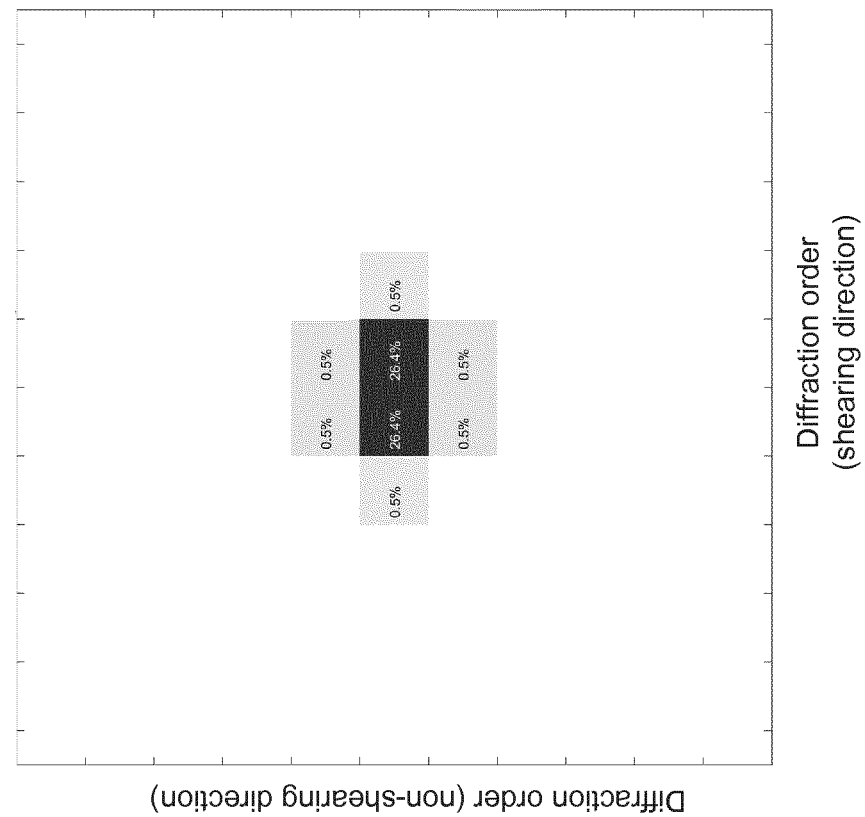
FIG. 19B shows an interference strength map for the measurement system shown in FIG. 4 when employing the first patterned region shown in FIG. 6A and the second patterned region shown in FIG. 19A, each of the interference strengths shown representing the second interference beams which contribute to the first harmonic of the oscillating phase-stepping signal and which have a different overlap, at the radiation detector, with a circle that represents the numerical aperture of the projection system.
Figure 19A:
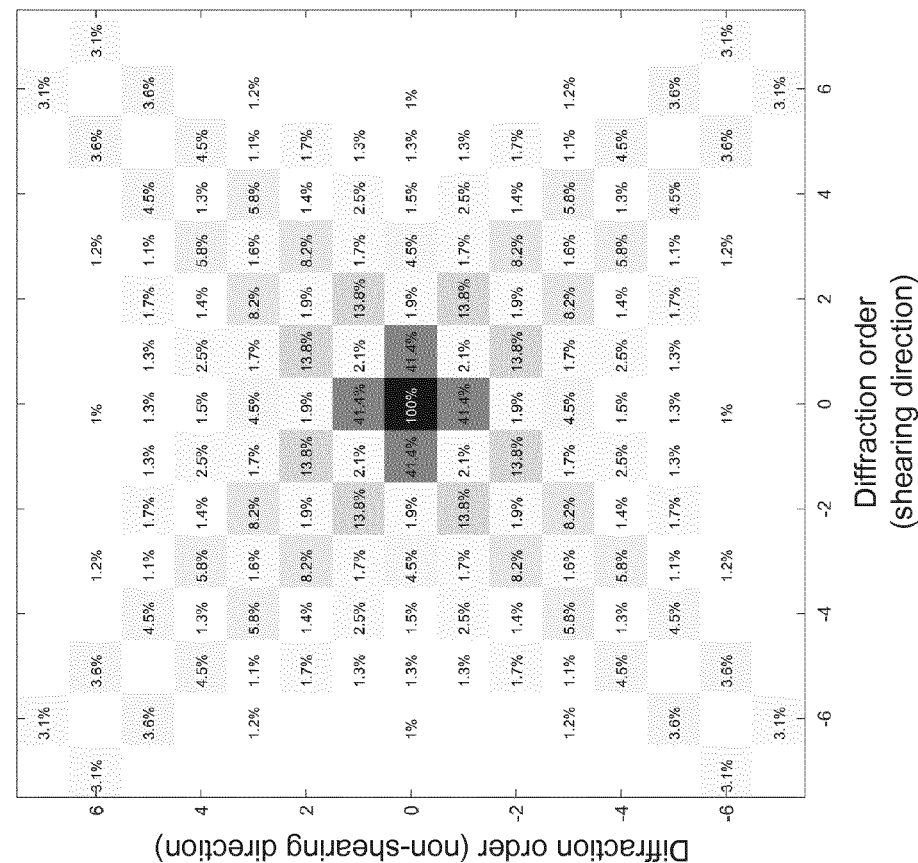
FIG. 19A shows the scattering efficiency for a two dimensional diffraction comprising the unit shown in FIG. 18 and which may represent the second patterned region of the measurement system shown in FIG. 4.

FIG. 19A shows the scattering efficiency for a second patterned region 32 that is of the form of the grating 80 having the unit cell 82 as shown in FIG. 18. The diffraction efficiencies shown in FIG. 19A are normalised to the efficiency of the (0, 0)$^{th}$ order diffraction beam, such that the efficiency of the (0, 0)$^{th}$ order diffraction beam is 100%.

FIG. 19B is a plot of the interference strengths $\gamma_{n,n+1}$ for interference beams that contribute to the first harmonic of the oscillating phase-stepping signal assuming a first patterned region 31 that is of the form of linear grating with a 50% duty cycle (i.e. of the geometry which results in scattering efficiency plot shown in FIG. 6A). FIG. 19B is constructed from the scattering efficiencies of FIGS. 6A and 19A in an analogous manner to the construction of FIG. 6C from the scattering efficiencies of FIGS. 6A and 6B).

It can be seen from FIG. 19A that the two-dimensional diffraction grating 80 shown in FIG. 18 results in a grating efficiency map that suppresses grating efficiencies of the (n, m)$^{th}$ diffraction orders wherein n±m is an even number except the (0, 0)$^{th}$ diffraction order. Although these diffraction orders are supressed, unlike the true checkerboard the scattering efficiencies of these diffraction orders are non-zero (but small relative to the other diffraction orders).

While the embodiment of a self-supporting grating 80 shown in FIG. 18 generally suppresses the grating efficiencies for all (n, m)$^{th}$ diffraction orders wherein n±m is an even number (whilst still being self-supporting). Some alternative embodiments may have geometries which are selected to ensure that the grating efficiencies for some specific (n, m)$^{th}$ diffraction orders are minimised, wherein n±m is an even number, as now discussed.

Third and fourth embodiments of self-supporting gratings according to the present invention are now described with reference to FIGS. 20A-21B.

The third and fourth embodiments of self-supporting gratings both comprise an array of circular apertures. In particular, the third and fourth embodiments of self-supporting gratings both have unit cells that are generally of the form of the unit cell 50 shown in FIG. 12 but which have modified duty cycles, as now described. The duty cycle of such a grating geometry may be characterized by a ratio of the radius of the circular apertures to the distance between the centres of adjacent apertures.

The third embodiment of a self-supporting grating comprises an array of circular apertures wherein the ratio of the radius of the circular apertures to the distance between the centres of adjacent apertures has been selected to minimise the (±2, 0) and (0,±2)diffraction orders (which are both zero for a perfect checkerboard grating). This is achieved by a ratio of the radius of the circular apertures to the distance between the centres of adjacent apertures of approximately 0.3. FIG. 20A shows the scattering efficiency for such a grating geometry. The diffraction efficiencies shown in FIG. 20A are normalised to the efficiency of the (0, 0)$^{th}$ order diffraction beam, such that the efficiency of the (0, 0)$^{th}$ order diffraction beam is 100%.

Figure 20B:
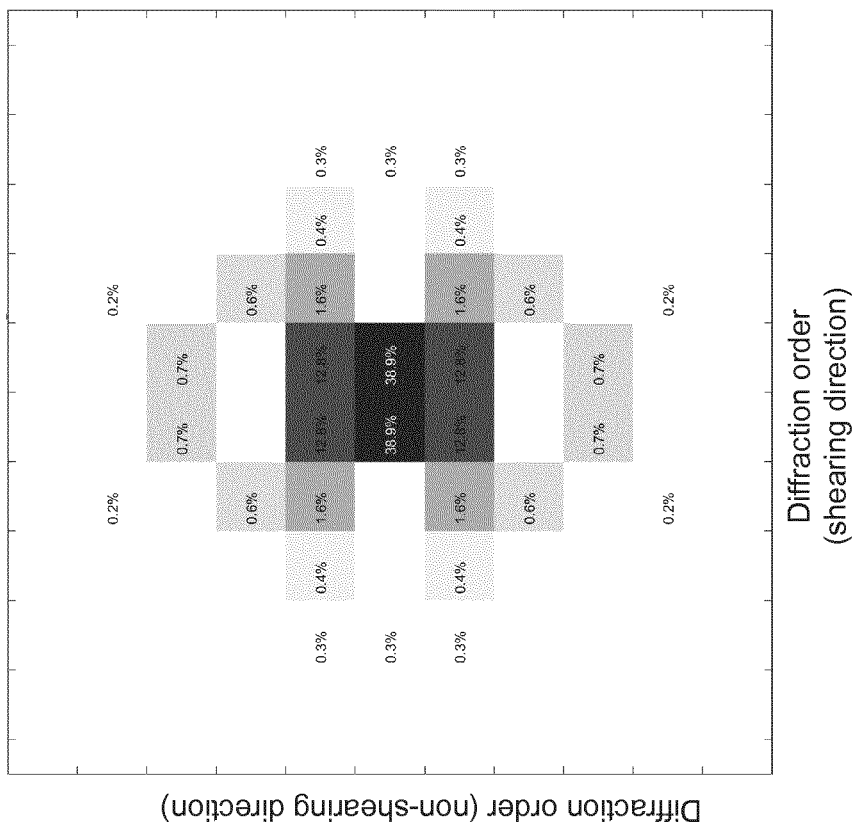
FIG. 20B shows an interference strength map for the measurement system shown in FIG. 4 when employing the first patterned region shown in FIG. 6A and the second patterned region shown in FIG. 20A, each of the interference strengths shown representing the second interference beams which contribute to the first harmonic of the oscillating phase-stepping signal and which have a different overlap, at the radiation detector, with a circle that represents the numerical aperture of the projection system.
Figure 20A:
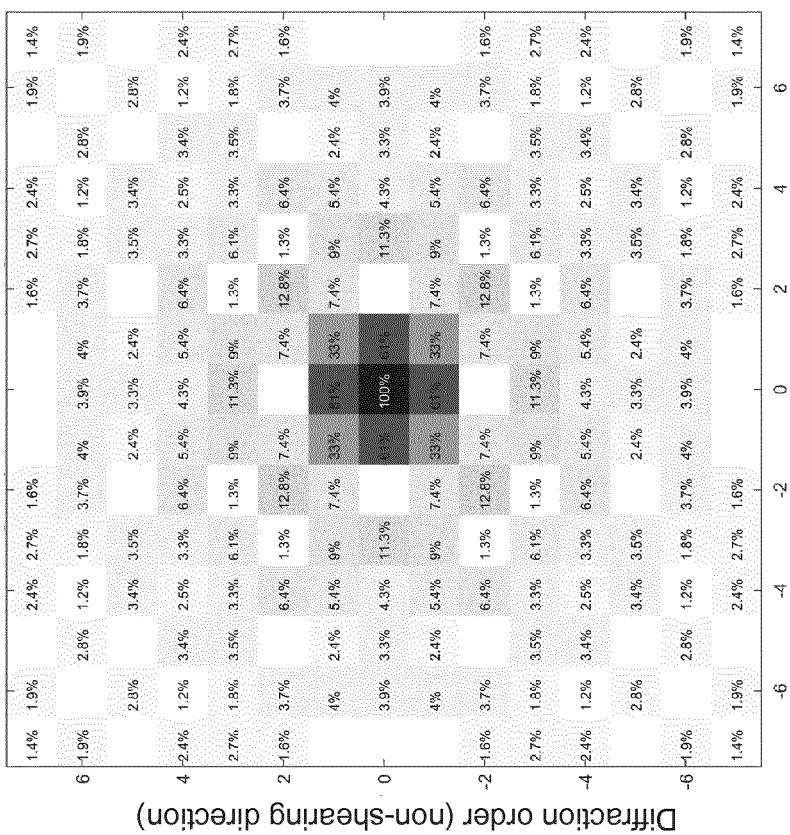
FIG. 20A shows the scattering efficiency for a third embodiment of a self-supporting two dimensional diffraction which may represent the second patterned region of the measurement system shown in FIG. 4.

FIG. 20B is a plot of the interference strengths $\gamma_{n,n+1}$ for interference beams that contribute to the first harmonic of the oscillating phase-stepping signal assuming a first patterned region 31 that is of the form of linear grating with a 50% duty cycle (i.e. of the geometry which results in scattering efficiency plot shown in FIG. 6A). FIG. 20B is constructed from the scattering efficiencies of FIGS. 6A and 20A in an analogous manner to the construction of FIG. 6C from the scattering efficiencies of FIGS. 6A and 6B).

Figures 21A, 21B:
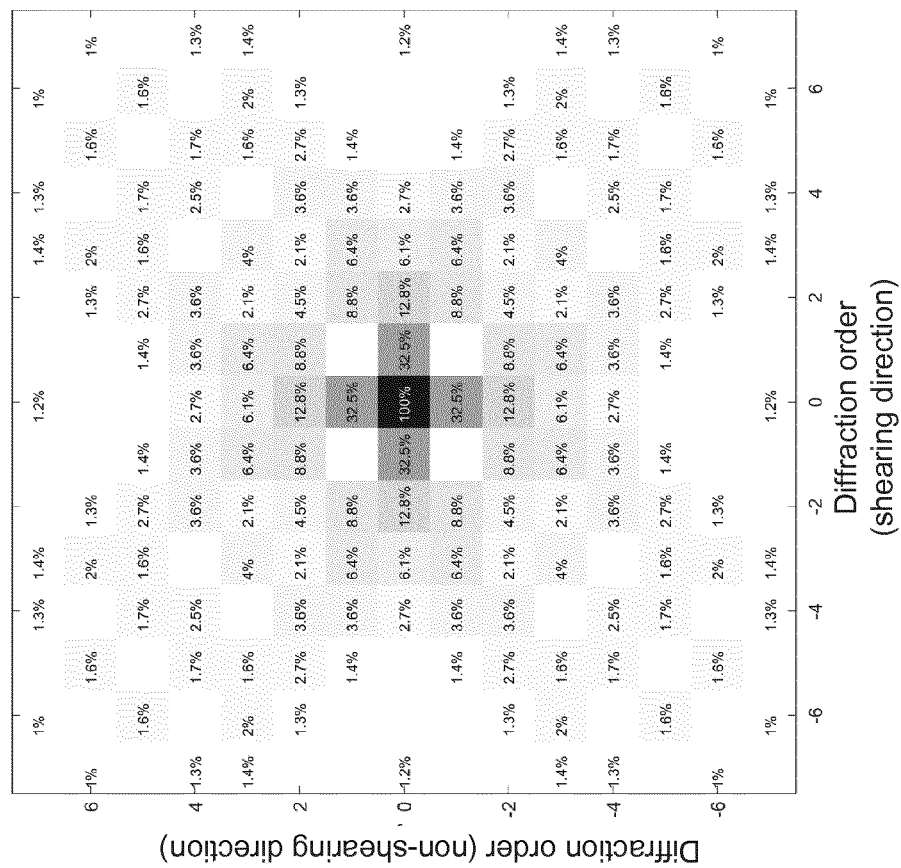
FIG. 21A shows the scattering efficiency for a fourth embodiment of a self-supporting two dimensional diffraction which may represent the second patterned region of the measurement system shown in FIG. 4.
FIG. 21B shows an interference strength map for the measurement system shown in FIG. 4 when employing the first patterned region shown in FIG. 6A and the second patterned region shown in FIG. 21A, each of the interference strengths shown representing the second interference beams which contribute to the first harmonic of the oscillating phase-stepping signal and which have a different overlap, at the radiation detector, with a circle that represents the numerical aperture of the projection system.

The fourth embodiment of a self-supporting grating comprises an array of circular apertures wherein the ratio of the radius of the circular apertures to the distance between the centres of adjacent apertures has been selected to minimise the (±1, ±1)diffraction orders (which are both zero for a perfect checkerboard grating). This is achieved by a ratio of the radius of the circular apertures to the distance between the centres of adjacent apertures of approximately 0.43. FIG. 21A shows the scattering efficiency for such a grating geometry. The diffraction efficiencies shown in FIG. 21A are normalised to the efficiency of the (0, 0)$^{th}$ order diffraction beam, such that the efficiency of the (0, 0)$^{th}$ order diffraction beam is 100%.

FIG. 21B is a plot of the interference strengths $\gamma_{n,n+1}$ for interference beams that contribute to the first harmonic of the oscillating phase-stepping signal assuming a first patterned region 31 that is of the form of linear grating with a 50% duty cycle (i.e. of the geometry which results in scattering efficiency plot shown in FIG. 6A). FIG. 21B is constructed from the scattering efficiencies of FIGS. 6A and 21A in an analogous manner to the construction of FIG. 6C from the scattering efficiencies of FIGS. 6A and 6B).

It can be seen from FIGS. 20B and 21B that these embodiments of self-supporting gratings comprising an array of circular apertures with modified duty cycles reduce the number of interference beams that significantly contribute to the first harmonic of the phase-stepping signal.

Some embodiments of the present invention relate to a method of designing a two-dimensional diffraction grating for a phase-stepping measurement system for determining an aberration map for a projection system PS. The method may comprise selecting a general geometry for the two-dimensional diffraction grating (for example an array of circular apertures), the general geometry having at least one parameter (for example a ratio of the radius of the circular apertures to the distance between the centres of adjacent apertures). The method may further comprise selecting values for the least one parameter that result in a grating efficiency map for the two-dimensional diffraction grating so as to control the contributions to a first harmonic of a phase stepping signal.

For example, for a given general geometry, it may be desirable to generally reduce the number of contributions to the first harmonic of the phase stepping signal. Additionally or alternatively, it may be desirable to enhance certain contributions to the first harmonic of a phase stepping signal and/or to suppress certain contributions to the first harmonic of a phase stepping signal.

The selection of values for the least one parameter that result in a grating efficiency map for the two-dimensional diffraction grating so as to control the contributions to a first harmonic of a phase stepping signal may assume a particular geometry for the first patterned region 31. For example a typical first patterned region 31 may be assumed. Typical first patterned regions 31 include the above-described one-dimensional diffraction grating 31 with a 50% duty cycle. Other typical first patterned regions 31 include a two-dimensional checkerboard diffraction grating with a 50% duty cycle.

The selection of the general geometry for the two-dimensional diffraction grating may take into account mechanical and thermal considerations. In particular, the general geometry for the two-dimensional diffraction grating may be selected such that the two-dimensional diffraction grating comprises a substrate provided with a square array of through-apertures wherein the two-dimensional diffraction grating is self-supporting.

In addition, the general geometry for the two-dimensional diffraction grating that is selected may be chosen such that the amount of substrate material provided between each through-aperture and the adjacent through apertures is sufficiently large to allow a heat load expected during use to be drained without damaging the two-dimensional diffraction grating.

Values for the least one parameter may be selected such that a grating efficiency of one or more diffraction orders are minimised, the one or more diffraction orders being the (n, m)$^{th}$ diffraction orders wherein n±m is an even number. For example, values for the least one parameter may be selected such that a grating efficiency the (±2, 0) and (0,±2)diffraction orders are minimised (as in the third embodiment described above with reference to FIGS. 120A and 20B). Alternatively, values for the least one parameter may be selected such that a grating efficiency of the (±1, ±1)diffraction orders are minimised (as in the fourth embodiment described above with reference to FIGS. 21A and 21B).

Although the above described embodiments use the first harmonic of the a phase stepping signal it will be appreciated that in alternative embodiments higher harmonics of the phase stepping signal may alternatively be used.

Although the above described embodiments use a first patterned region 31 comprising a one-dimensional diffraction grating 31 with a 50% duty cycle it will be appreciated that in alternative embodiments other the first patterned region 31 may use different geometries. For example, in some embodiments, the first patterned region 31 may comprise a two-dimensional checkerboard diffraction grating with a 50% duty cycle.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A two-dimensional diffraction grating for a phase-stepping measurement system for determining an aberration map for a projection system, the diffraction grating comprising:
  a substrate provided with a square array of through-apertures having a checkerboard pattern, the substrate comprising:
    a support layer; and
    a radiation absorbing layer,
  wherein the diffraction grating is transmissive,
  wherein the radiation absorbing layer is separate from the support layer,
  wherein the square array of through-apertures extend through both the support layer and the radiation absorbing layer,
  wherein the square array of through-apertures are non-regular octagonal and the square array of through-apertures are formed from a square having truncated corners, such that a connecting portion is formed between each two adjacent apertures, and
  wherein the connecting portion has at least two parallel sides.

2. The two-dimensional diffraction grating of claim 1, wherein a geometry of the two-dimensional diffraction grating is arranged to result in a grating efficiency map that reduces a number of contributions above a threshold to a harmonic of a phase stepping signal in response to the two-dimensional diffraction grating being used with a first patterned region that comprises a one-dimensional diffraction grating with a 50% duty cycle or a two-dimensional checkerboard diffraction grating with a 50% duty cycle.

3. The two-dimensional diffraction grating of claim 1, wherein:
  a geometry of the two-dimensional diffraction grating is arranged to result in a grating efficiency map that suppresses grating efficiencies of the $(n, m)^{th}$ diffraction orders, where either n or m is a non-zero even number;
  the square array of through-apertures are square apertures having a length that is half the distance between centers of adjacent through-apertures; and
  the sides of the square apertures are parallel to the axes of the square array of through-apertures.

4. The two-dimensional diffraction grating of claim 1, wherein a geometry of the two-dimensional diffraction grating is arranged to result in a grating efficiency map that suppresses grating efficiencies of the $(n, m)^{th}$ diffraction orders wherein n±m is an even number except the $(0, 0)^{th}$ diffraction order.

5. The two-dimensional diffraction grating of claim 4, wherein the square is orientated at 45° to the axes of the square array of through-apertures and has a diagonal dimension that matches a distance between the centers of adjacent through-apertures, and
  wherein the connecting portion of the substrate between each pair of adjacent through apertures is generally rectangular.

6. The two-dimensional diffraction grating of claim 5, wherein a width of the generally rectangular connecting portion of the substrate between each pair of adjacent through apertures is approximately 10% of the distance between centers of adjacent through-apertures.

7. The two-dimensional diffraction grating of claim 1, wherein a geometry of the two-dimensional diffraction grating is arranged to result in a grating efficiency map that suppresses a grating efficiency of one or more diffraction orders, the one or more diffraction orders being the $(n, m)^{th}$ diffraction orders wherein n±m is an even number.

8. The two-dimensional diffraction grating of claim 7, wherein the geometry of the two-dimensional diffraction grating is arranged to suppress (±2, 0) and (0,±2) diffraction orders.

9. The two-dimensional diffraction grating of claim 7, wherein the geometry of the two-dimensional diffraction grating is arranged to suppress (±1,±1) diffraction orders.

10. The two-dimensional diffraction grating of claim 1, wherein a width of the connecting portion is from about 5% to about 15% of a distance between centers of two adjacent apertures.

11. A method of manufacturing a two-dimensional diffraction grating for a phase-stepping measurement system for determining an aberration map for a projection system, the method comprising:
 selecting a geometry for the two-dimensional diffraction grating, the geometry having at least one parameter; and
 selecting values for the at least one parameter that result in a grating efficiency map for the two-dimensional diffraction grating so as to control contributions to a harmonic of a phase stepping signal,
 wherein the two-dimensional diffraction grating is transmissive,
 wherein the two-dimensional diffraction grating comprises a substrate provided with a square array of through-apertures having a checkerboard pattern,
 wherein the substrate comprises a support layer and a radiation absorbing layer,
 wherein the support layer is separate from the radiation absorbing layer,
 wherein the square array of through-apertures extend through both the support layer and the radiation absorbing layer,
 wherein the square array of through-apertures are non-regular octagonal and the square array of through-apertures are formed from a square having truncated corners, such that a connecting portion is formed between each two adjacent apertures, and
 wherein the connecting portion has at least two parallel sides.

12. The method of claim 11, wherein the selection of values for the least one parameter that result in the grating efficiency map for the two-dimensional diffraction grating so as to control the contributions to a harmonic of a phase stepping signal results from the two-dimensional diffraction grating being used with a first patterned region that comprises a one-dimensional diffraction grating with a 50% duty cycle or a two-dimensional checkerboard diffraction grating with a 50% duty cycle.

13. The method of claim 11, wherein:
 the selecting values for the least one parameter comprises selecting values for the least one parameter that minimizes a grating efficiency of one or more diffraction orders, the one or more diffraction orders being the (n, m)$^{th}$ diffraction orders, wherein n±m is an even number, and
 the step of selecting values for the least one parameter involves selecting values for the least one parameter that minimizes a grating efficiency of (±2, 0) and (0,±2) diffraction orders.

14. The method of claim 11, wherein the selecting values for the least one parameter comprises selecting values for the least one parameter that minimizes a grating efficiency of (±1, ±1) diffraction orders.

15. The method of claim 11, further comprising:
 fabricating the two-dimensional diffraction grating using the selected values.

16. A two-dimensional diffraction grating, comprising:
 a geometry configured to be selected to have at least one parameter, such that the least one parameter is configured to result in a grating efficiency map for the two-dimensional diffraction grating so as to control contributions to a harmonic of a phase stepping signal,
 wherein the two-dimensional diffraction grating is transmissive,
 wherein the two-dimensional diffraction grating comprises a substrate provided with a square array of through-apertures,
 wherein the substrate comprises a support layer and a radiation absorbing layer,
 wherein the support layer is separate from the radiation absorbing layer,
 wherein the square array of through-apertures extend through both the support layer and the radiation absorbing layer, and the square array of through-apertures are non-regular octagonal, and
 wherein each through-aperture is formed from a square having a diagonal dimension that matches a distance between centers of two adjacent apertures.

* * * * *

UNITED STATES PATENT AND TRADEMARK OFFICE
CERTIFICATE OF CORRECTION

PATENT NO. : 12,007,590 B2
APPLICATION NO. : 16/965172
DATED : June 11, 2024
INVENTOR(S) : De Groot et al.

Page 1 of 1

It is certified that error appears in the above-identified patent and that said Letters Patent is hereby corrected as shown below:

In the Specification

In Column 5, Line 48, delete "0th" and replace with --$0^{th}$--.

In Column 21, Line 53, delete "1st" and replace with --$1^{st}$--.

In Column 26, Line 54, delete "±1'" and replace with --$±1^{st}$--.

In Column 29, Line 20, delete "γ," and replace with --$γi$--.

In Column 33, Line 12, after "by" insert --$\sqrt{2}$--.

In Column 35, Line 63, after "(i.e." insert --n±m=--.

In Column 36, Line 5, after "(i.e." insert --n±m=...,--.

Signed and Sealed this
Twenty-fourth Day of December, 2024

Derrick Brent
*Acting Director of the United States Patent and Trademark Office*